US011818485B2

(12) United States Patent
Kim

(10) Patent No.: US 11,818,485 B2
(45) Date of Patent: Nov. 14, 2023

(54) IMAGE SENSOR INCLUDING SPIDER ROUTING

(71) Applicant: Samsung Electronics Co., Ltd., Suwon-si (KR)

(72) Inventor: Moo Young Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 51 days.

(21) Appl. No.: 17/684,697

(22) Filed: Mar. 2, 2022

(65) Prior Publication Data
US 2022/0321817 A1 Oct. 6, 2022

(30) Foreign Application Priority Data

Apr. 6, 2021 (KR) .................. 10-2021-0044707

(51) Int. Cl.
*H04N 25/75* (2023.01)
*H04N 25/79* (2023.01)
*H01L 27/146* (2006.01)
*H01L 23/00* (2006.01)

(52) U.S. Cl.
CPC ............ *H04N 25/75* (2023.01); *H04N 25/79* (2023.01); *H01L 24/08* (2013.01); *H01L 27/1463* (2013.01); *H01L 27/14621* (2013.01); *H01L 27/14627* (2013.01); *H01L 27/14634* (2013.01); *H01L 27/14636* (2013.01); *H01L 27/14645* (2013.01); *H01L 2224/08145* (2013.01)

(58) Field of Classification Search
CPC ...... H04N 25/75; H04N 25/79; H04N 25/766; H04N 25/772; H01L 27/14621; H01L 27/14627; H01L 27/1463; H01L 27/14634; H01L 27/14636; H01L 27/14645
See application file for complete search history.

(56) References Cited

U.S. PATENT DOCUMENTS

| 9,134,583 | B2 | 9/2015 | Shim et al. | |
| 10,199,416 | B2 | 2/2019 | Sugihara | |
| 2017/0033141 | A1* | 2/2017 | Sugihara | H01L 27/14612 |
| 2020/0321383 | A1* | 10/2020 | Jung | H01L 27/14634 |

(Continued)

FOREIGN PATENT DOCUMENTS

| JP | 3617403 B2 | 2/2005 |
| JP | 2009-130828 A | 6/2009 |

(Continued)

*Primary Examiner* — Lin Ye
*Assistant Examiner* — John H Morehead, III
(74) *Attorney, Agent, or Firm* — Harness, Dickey & Pierce, P.L.C.

(57) ABSTRACT

An image sensor includes first and second column lines, and a read circuit configured to receive pixel signals through the first and second column lines. The first column line and the second column line each include a main wire, a first wire between one end of the main wire and the first interlayer connection region, and a second wire connected with an opposite end of the main wire. A first distance between the first and second column lines is longer than a second distance between a connection point of the first column line and the first interlayer connection region and a connection point of the second column line and the first interlayer connection region. A length of the first wire of the first column line is greater than a length of the first wire of the second column line.

20 Claims, 17 Drawing Sheets

(56) References Cited

U.S. PATENT DOCUMENTS

2021/0265411 A1* 8/2021 Tamaki ............. H01L 27/14683
2021/0407982 A1* 12/2021 Liu ........................ H01L 25/50

FOREIGN PATENT DOCUMENTS

| KR | 10-2006-0013109 A | 2/2006 |
| KR | 10-2012-0047538 A | 5/2012 |
| KR | 10-1903019 B1 | 10/2018 |

* cited by examiner

IMAGE SENSOR INCLUDING SPIDER ROUTING

CROSS-REFERENCE TO RELATED APPLICATIONS

This application claims priority under 35 U.S.C. § 119 to Korean Patent Application No. 10-2021-0044707 filed on Apr. 6, 2021, in the Korean Intellectual Property Office, the disclosures of which are incorporated by reference herein in their entireties.

BACKGROUND

The present inventive concepts relate to image sensors, and more particularly, relate to image sensors including a spider routing capable of preventing the reduction of performance according to a time constant difference of column lines.

Image sensors include charge coupled device (CCD) image sensors, complementary metal-oxide semiconductor (CMOS) image sensors (CIS), etc. The CMOS image sensor includes pixels implemented with CMOS transistors and converts light energy into an electrical signal by using a photoelectric conversion element included in each pixel. The CMOS image sensor obtains information about a captured/photographed image by using the electrical signal generated at each pixel.

Nowadays, the sharp increase in the number (e.g., quantity) of pixels and the decrease in a pixel size (e.g., pixel area) make it possible to provide the user with an ultra-high-definition (UHD) image. For example, a way to place an analog-to-digital converter, the width of which is narrower than a width of a pixel array, in an image sensor is being used as a way to reduce a chip size, and the way to place accompanies a spider routing of column lines through which outputs of pixels are transferred to the analog-to-digital converter. However, the spider routing causes a time constant difference of column lines. This means that the performance of the image sensor is reduced.

SUMMARY

Some example embodiments of the present inventive concepts provide a spider routing configured to reduce or prevent the reduction of performance according to a time constant difference of column lines of an image sensor. The spider routing may enable reduction of a time constant difference of column lines of an image sensor that includes the spider routing.

According to some example embodiments, an image sensor may include a pixel array that includes a first pixel connected with a first column line, and a second pixel connected with a second column line spaced from the first column line in a first direction, and a read circuit that receives pixel signals through the first column line and the second column line connected with a first interlayer connection region. The first column line may include a main wire of the first column line that extends in a second direction perpendicular to the first direction, a first wire of the first column line that is between one end of the main wire of the first column line and the first interlayer connection region, and a second wire of the first column line that is connected with an opposite end of the main wire of the first column line. The second column line may include a main wire of the second column line that extends in the second direction, a first wire of the second column line that is between one end of the main wire of the second column line and the first interlayer connection region, and a second wire of the second column line that is connected with an opposite end of the main wire of the second column line. A first distance between the main wire of the first column line and the main wire of the second column line may be longer than a second distance between a point where the first column line is connected with the first interlayer connection region and a point where the second column line is connected with the first interlayer connection region. A length of the first wire of the first column line may be greater than a length of the first wire of the second column line. A length of the second wire of the first column line may be smaller than a length of the second wire of the second column line.

According to some example embodiments, an image sensor may include a first semiconductor chip including a pixel array and a first interlayer connection region. The pixel array may include a first pixel connected with a first column line, and a second pixel connected with a second column line isolated from direct contact with the first column line in a first direction. The first column line and the second column line may be connected with the first interlayer connection region. The image sensor may include a second semiconductor chip that includes a second interlayer connection region and a read circuit. The read circuit may include analog-to-digital converters configured to process outputs of the first pixel and the second pixel. The first column line may include a main wire of the first column line that extends in a second direction perpendicular to the first direction, a first wire of the first column line that is between one end of the main wire of the first column line and the first interlayer connection region, and a second wire of the first column line that is connected with an opposite end of the main wire of the first column line. The second column line may include a main wire of the second column line that extends in the second direction, a first wire of the second column line that is between one end of the main wire of the second column line and the first interlayer connection region, and a second wire of the second column line that is connected with an opposite end of the main wire of the second column line. A first distance between the main wire of the first column line and the main wire of the second column line may be longer than a second distance between a point where the first column line is connected with the first interlayer connection region and a point where the second column line is connected with the first interlayer connection region. A length of the first wire of the first column line may be greater than a length of the first wire of the second column line. A length of the second wire of the first column line may be smaller than a length of the second wire of the second column line. The first interlayer connection region and the second interlayer connection region may be electrically connected.

According to some example embodiments, an image sensor may include a first semiconductor chip including a pixel array and a first interlayer connection region. The pixel array may include a first pixel connected with a first column line, and a second pixel connected with a second column line isolated from direct contact with the first column line in a first direction. The first column line and the second column line may be connected with the first interlayer connection region. The image sensor may include a second semiconductor chip that includes a read circuit and a second interlayer connection region electrically connected with the first interlayer connection region. The read circuit may include a first analog-to-digital converter configured to process an output of the first pixel, and a second analog-to-digital converter configured to process an output of the second pixel. The first column line may include a main wire of the first column line that extends in a second direction perpendicular to the first direction and includes one end connected with the first interlayer connection region, and a first wire of the first column line that is connected with an opposite end of the main wire. The second column line may include a main wire of the second column line that extends in the second direction and includes one end connected with the first interlayer connection region, and a first wire of the second column line that is connected with an opposite end of the main wire of the second column line. The second semiconductor chip may further include a third wire electrically connected with the first column line through the first interlayer connection region and the second interlayer connection region and electrically connected with the first analog-to-digital converter. The second semiconductor chip may further include a fourth wire electrically connected with the second column line through the first interlayer connection region and the second interlayer connection region and electrically connected with the second analog-to-digital converter. A first distance between the main wire of the first column line and the main wire of the second column line may be longer than a second distance between a point where the third wire is connected with the first analog-to-digital converter and a point where the fourth wire is connected with the second analog-to-digital converter. A length of the first wire of the first column line may be longer than a length of the third wire.

BRIEF DESCRIPTION OF THE DRAWINGS

The above and other objects and features of the present inventive concepts will become apparent by describing in detail example embodiments thereof with reference to the accompanying drawings.

DETAILED DESCRIPTION

Figure 1:
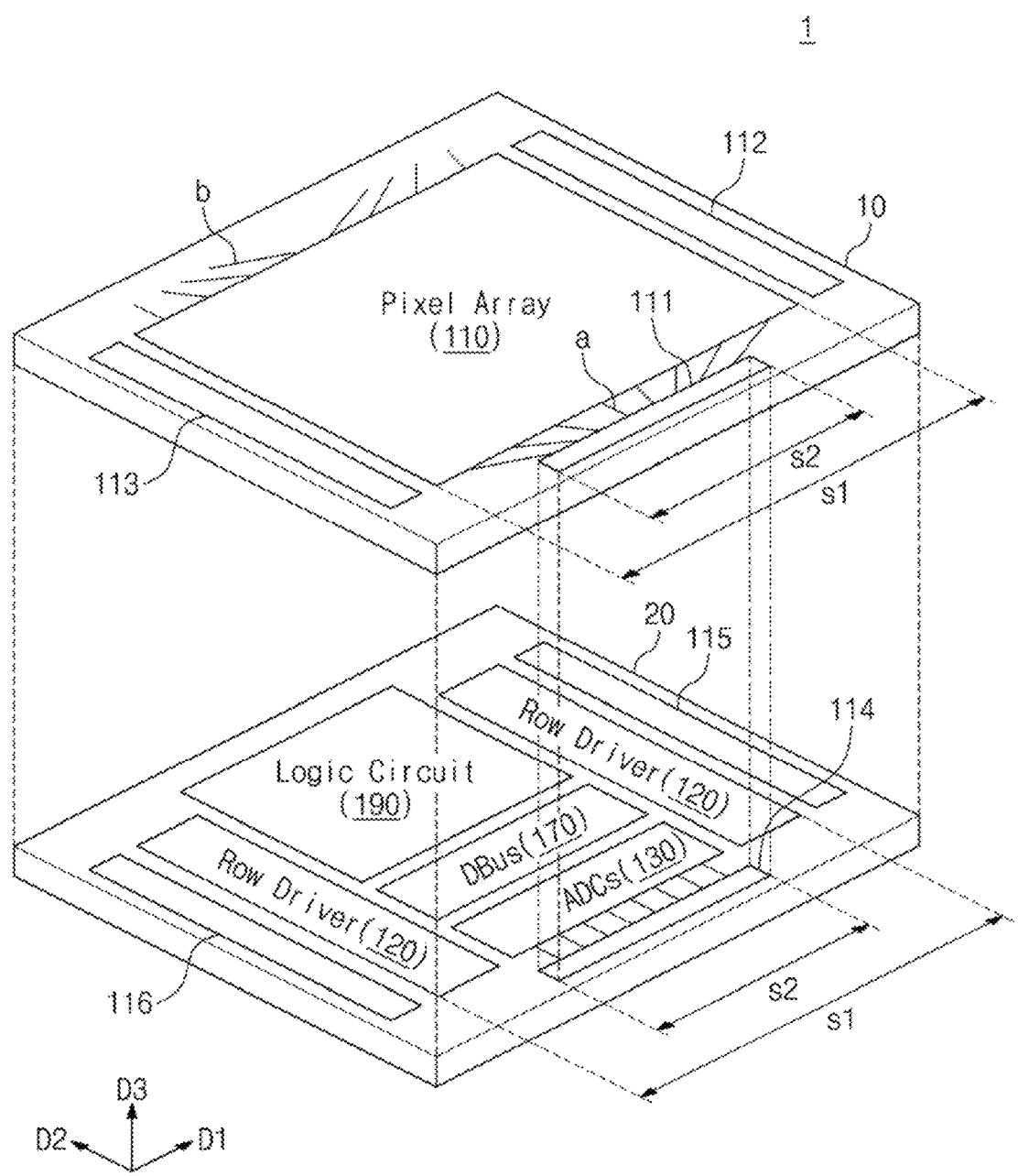
FIG. 1 illustrates a configuration of an image sensor according to some example embodiments of the present inventive concepts.

Below, some example embodiments of the present inventive concepts may be described in detail and clearly to such an extent that an ordinary one in the art easily implements the inventive concepts.

In the detailed description, components described with reference to the terms "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 illustrates a configuration of an image sensor according to some example embodiments of the present inventive concepts. An image sensor 1 may include a first semiconductor chip 10 and a second semiconductor chip 20. The first semiconductor chip 10 may include a first interlayer connection region 111, a second interlayer connection region 112, a third interlayer connection region 113, and a pixel array 110. The second semiconductor chip 20 may include a fourth interlayer connection region 114, a fifth interlayer connection region 115, a sixth interlayer connection region 116, row drivers 120, analog-to-digital converters 130, a data bus 170, and a logic circuit 190. In some example embodiments, at least the analog-to-digital converters 130, the data bus 170, and/or the logic circuit 190 may be included in a read circuit as described herein, that is included in the second semiconductor chip 20, such that the second semiconductor chip 20 may in some example embodiments be understood to include at least the fourth interlayer connection region and a read circuit. The elements described as being included in the first semiconductor chip 10 or the second semiconductor chip 20 may be understood to be "formed on," "on," "in," "included in," and/or "part of" the respective first semiconductor chip 10 or second semiconductor chip 20.

Under control of the logic circuit 190, the second semiconductor chip 20 may transmit a signal for controlling the pixel array 110 to the first semiconductor chip 10. For example, under control of the logic circuit 190, the row drivers 120 may transmit a control signal for controlling pixels of the pixel array 110 to the pixel array 110 through the fifth interlayer connection region 115 and the second interlayer connection region 112 and/or through the sixth interlayer connection region 116 and the third interlayer connection region 113. The pixel array 110 may output a pixel signal, and the output pixel signal may be transmitted to the analog-to-digital converters 130 through the first interlayer connection region 111 and the fourth interlayer connection region 114. In some example embodiments, the fourth interlayer connection region 114 may be referred to herein as a "second interlayer connection region" and may be understood to be electrically connected with the first interlayer connection region 111.

The analog-to-digital converters 130 and the logic circuit 190 may perform a correlated double sampling operation on the pixel signal, and a result of the correlated double sampling may be transmitted to the logic circuit 190 through the data bus 170. The logic circuit 190 may include a buffer for storing the result of the correlated double sampling, an image signal processor (ISP) front end circuit, an ISP, etc. In this case, the logic circuit 190 may perform the following processing on pixel data received from the analog-to-digital converters 130 through the data bus 170 (e.g., the logic circuit 190 may process an output of the analog-to-digital converters 130, e.g., digital signals generated by the analog-to-digital converters 130): crosstalk compensation, auto dark level compensation (ADLC) for removing a fixed pattern noise (FPN). In addition, logic circuit 190 may further perform the following processings on the pixel data: color interpolation, auto white balance, gamma correction, color saturation correction, formatting, bad pixel correction, and hue correction.

In some example embodiments, a length s1 of the pixel array 110 of the first semiconductor chip 10 in a first direction D1 may be greater than a length s2 of the first interlayer connection region 111 in the first direction D1. As a result, lengths of column lines through which pixel outputs of the pixel array 110 are transferred may be different from each other due to differences between first wires "a" of the column lines. For example, a length of a column line disposed at the center of the pixel array 110 may be relatively short, and a length of a column line disposed on a side of the pixel array 110 may be relatively long. Due to a difference between the length s1 of the pixel array 110 and the length s2 of the first interlayer connection region 111, column lines may be arranged such that a distance between the first wires "a" decreases. This placement may be called a "spider routing".

In some example embodiments, the length s1 of the row drivers 120 and the analog-to-digital converters 130 of the second semiconductor chip 20 in the first direction D1 may be generally (or substantially) equal to the length Si of the pixel array 110 of the first semiconductor chip 10 in the first direction D1. That is, the length s1 of the pixel array 110 in the first direction D1 may be greater than the length s2 of the analog-to-digital converters 130 in the first direction D1. The length s2 of the analog-to-digital converters 130 in the first direction D1 may be generally (or substantially) equal to the length s2 of the fourth interlayer connection region 114 in the first direction D1.

Meanwhile, a length difference of column lines due to the above spider routing causes a resistance value difference of the column lines and a capacitance value difference of the column lines, and a time constant (i.e., an RC time constant) difference is caused thereby. A time constant difference of column lines may also cause a settling time difference of pixel outputs output from column lines. The image sensor 1 of the present inventive concepts may further include a second wire "b" for solving an issue due to a setting time difference of pixel outputs. For example, the second wire "b" may be provided in a region that is opposite to (or faces away from) a region where the first wire "a" is formed. As a result, lengths of column lines of the pixel array 110 may become equal to each other through the wires "b" additionally provided to the column lines. This may mean that time constants of column lines become equal to each other.

Figure 2:
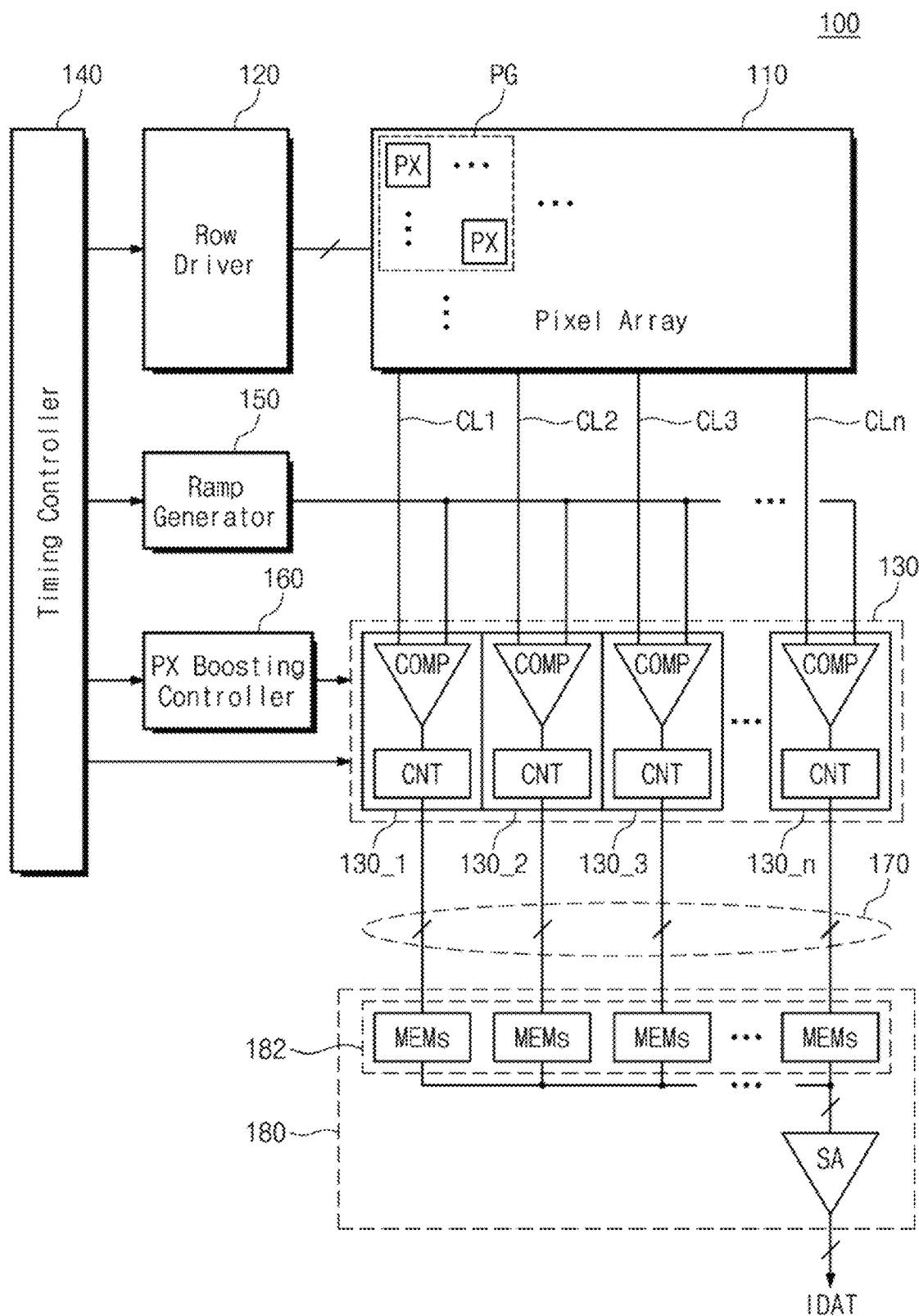
FIG. 2 illustrates a configuration of an image sensor of FIG. 1 according to some example embodiments of the present inventive concepts.

FIG. 2 illustrates a configuration of the image sensor 1 of FIG. 1. An image sensor 100 may include the pixel array 110, the row driver 120, the analog-to-digital converters 130, a timing controller 140, a ramp signal generator 150, a pixel boosting controller 160, the data bus 170, and a buffer 180. The pixel array 110, the row driver 120, and the analog-to-digital converters 130 of FIG. 2 may respectively correspond to the pixel array 110, the row driver 120, and the analog-to-digital converters 130 of FIG. 1. The timing controller 140, the ramp signal generator 150, the pixel boosting controller 160, and the buffer 180 of FIG. 2 may correspond to the logic circuit 190 of FIG. 1. The analog-to-digital converters 130, the timing controller 140, the ramp signal generator 150, the pixel boosting controller 160, and the buffer 180 may be collectively referred to as a "read circuit". Because the timing controller 140, the ramp signal generator 150, the pixel boosting controller 160, and the buffer 180 of FIG. 2 may correspond to the logic circuit 190 of FIG. 1, it will be understood that the "read circuit" as described herein may include the logic circuit 190. It will further be understood that the "read circuit" may be implemented by one or more instances of "processing circuitry" as described herein. Such processing circuitry may be understood to include any of the structures, connections, or the like as described herein with regard to any of the analog-to-digital converters 130, the timing controller 140, the ramp signal generator 150, the pixel boosting controller 160, the buffer 180, the logic circuit 190, any combination thereof, or the like. Such processing circuitry may be understood to be configured to implement any of the functionality of any of the elements of the "read circuit," including the functionality of any of the analog-to-digital converters 130, the timing controller 140, the ramp signal generator 150, the pixel boosting controller 160, the buffer 180, the logic circuit 190, any combination thereof, or the like.

The pixel array 110 may include a plurality of pixels PX arranged in the form of a matrix along rows and columns. Each of the plurality of pixels PX may include a photoelectric conversion element. Each of the plurality of pixels PX may sense a light by using the photoelectric conversion element and may convert the sensed light into an electrical signal (hereinafter referred to as a "pixel signal"). For example, the photoelectric conversion element may include a photo diode, a photo transistor, a photo gate, a pinned photo diode, etc.

The plurality of pixels PX constituting the pixel array 110 may be divided into a plurality of pixel groups PG. Each pixel group PG may include two or more pixels PX. In some example embodiments, the pixel group PG may include 9 pixels PX arranged in 3 rows and 3 columns or may include 4 pixels PX arranged in 2 rows and 2 columns. However, the number of pixels constituting the pixel group PG is not limited thereto.

Pixels PX of the pixel group PG may share at least one floating diffusion region or two or more floating diffusion regions. For example, the pixels PX of the pixel group PG may share only one floating diffusion region. In this case, the pixels PX of each pixel group PG may be connected in common with one column line (e.g., CL1). Alternatively, the pixels PX of the pixel group PG may share a plurality of floating diffusion regions. In more detail, pixels PX of the pixel group PG belonging to a first column may share a first floating diffusion region, pixels PX of the pixel group PG belonging to a second column may share a second floating diffusion region, and pixels PX of the pixel group PG belonging to a third column may share a third floating diffusion region. In this case, in FIG. 2, the pixels PX of the pixel group PG belonging to the first column may be connected in common with the column line CL1, the pixels PX of the pixel group PG belonging to the second column may be connected in common with a column line CL2, and the pixels PX of the pixel group PG belonging to the third column may be connected in common with a column line CL3. For example, the pixels PX of the pixel array 110 may include a first pixel PX connected with a first column line CL1, and a second pixel PX connected with a second column line CL2. As shown in at least FIGS. 4-5, the first column line CL1, second column line CL2, and the like (e.g., CL1 to CLn) may be spaced from each other (e.g., isolated from direct contact with each other) in the first direction D1. The column lines CL1 to CLn may be connected with the first interlayer connection region 111.

The pixel group PG may include pixels of the same type for outputting information about the same color. For example, the pixel group PG may include red pixels "R" to convert a light of a red spectrum into an electrical signal, green pixels Gr/Gb to convert a light of a green spectrum into an electrical signal, or blue pixels "B" to convert a light of a blue spectrum into an electrical signal. To this end, a plurality of color filters may be formed above the pixel group PG, and thus, a multi-color filter array (multi-CFA) may be implemented.

The row driver 120 may select and drive a row of the pixel array 110. The row driver 120 may decode an address and/or a control signal generated by the timing controller 140 and may generate control signals for selecting and driving a row of the pixel array 110. For example, the control signals may include a signal for selecting a pixel, a signal for resetting a floating diffusion region, a signal for selecting a column line, etc.

The "read circuit" collectively defined by the analog-to-digital converters 130, the timing controller 140, the ramp signal generator 150, the pixel boosting controller 160, and the buffer 180 may be configured to receive pixel signals from the pixels PX of the pixel array 110 (e.g., receive pixel signals from the first and second pixels PX through the first column line CL1 and the second column line CL2, respectively, connected with a first interlayer connection region 111). The analog-to-digital converters 130 (and thus a "read circuit" configured to implement the functionality and/or structure of same) may convert an analog signal (i.e., a pixel signal) output from the pixel array 110 (e.g., one or more pixels PX thereof), and which may be received at the read circuit via an interlayer interconnection region (e.g., the fourth interlayer connection region 114) to a digital signal. Such digital signal may be further processed by the logic circuit 190 of (e.g., implemented by the processing circuitry of) the read circuit. In some example embodiments, the analog-to-digital converters 130 may include a plurality of analog-to-digital converters 130_1 to 130_n, each of which includes a comparator COMP and a counter CNT. The comparator COMP may compare a pixel signal output through a column line (i.e., one of CL1 to CLn) connected with the comparator COMP with a ramp signal received from the ramp signal generator 150 and may output a comparison result. The comparator COMP may operate based on a correlated double sampling (CDS) technique for obtaining a reset signal and an image signal from a pixel signal and extracting a difference between the reset signal and the image signal as an effective signal component. Each of the analog-to-digital converters 130_1 to 130_n may transmit a result of the correlated double sampling to the buffer 180 through the data bus 170.

The counter CNT may count pulses of an output signal of the corresponding comparator COMP. For example, the counter CNT may operate in response to various control signals, which are generated by the timing controller 140, such as a counter clock signal, a counter reset signal for controlling a reset of the counter CNT, and an inversion signal for inverting an internal bit of the counter CNT. The counter CNT may count a comparison result signal depending on the counter clock signal and may output a counting result as a digital signal.

The counter CNT may include an up/down counter, a bit-wise inversion counter, etc. An operation of the bit-wise counter may be similar to an operation of the up/down counter. For example, the bit-wise counter may perform a function of performing only up-counting and a function of converting all internal bits of the counter to obtain the 1's complement when a specific signal is received. The bit-wise counter may perform a reset count and may then invert a result of the reset count to the 1's complement, that is, a negative value.

The timing controller 140 may generate a control signal and/or a clock for controlling an operation and/or a timing of each of the row driver 120, the analog-to-digital converters 130, the ramp signal generator 150, and the pixel boosting controller 160.

The ramp signal generator 150 may generate the ramp signal. The ramp signal generator 150 may operate under control of the timing controller 140. For example, the ramp signal generator 150 may operate in response to a control signal such as a ramp enable signal or a mode signal. When the ramp enable signal is activated, the ramp signal generator 150 may generate the ramp signal having a slope set based on the mode signal.

The pixel boosting controller 160 may control a settling time of pixel signals output from the column lines CL1 to CLn. For example, the pixel boosting controller 160 may generate a signal for controlling a discharge of each column line such that a pixel signal output from each column line is quickly stabilized.

The buffer 180 may include a set 182 of memories MEMs and a sense amplifier SA. Each of the memories MEMs may receive a digital signal output from the corresponding analog-to-digital converter through the data bus 170 and may store the received digital signal. The sense amplifier SA may sense and amplify the digital signals stored in the memories MEMs. The sense amplifier SA may output the amplified digital signals as image data IDAT. For example, the image data IDAT may include information about a color of an object and information about a phase of the object.

Figure 3:
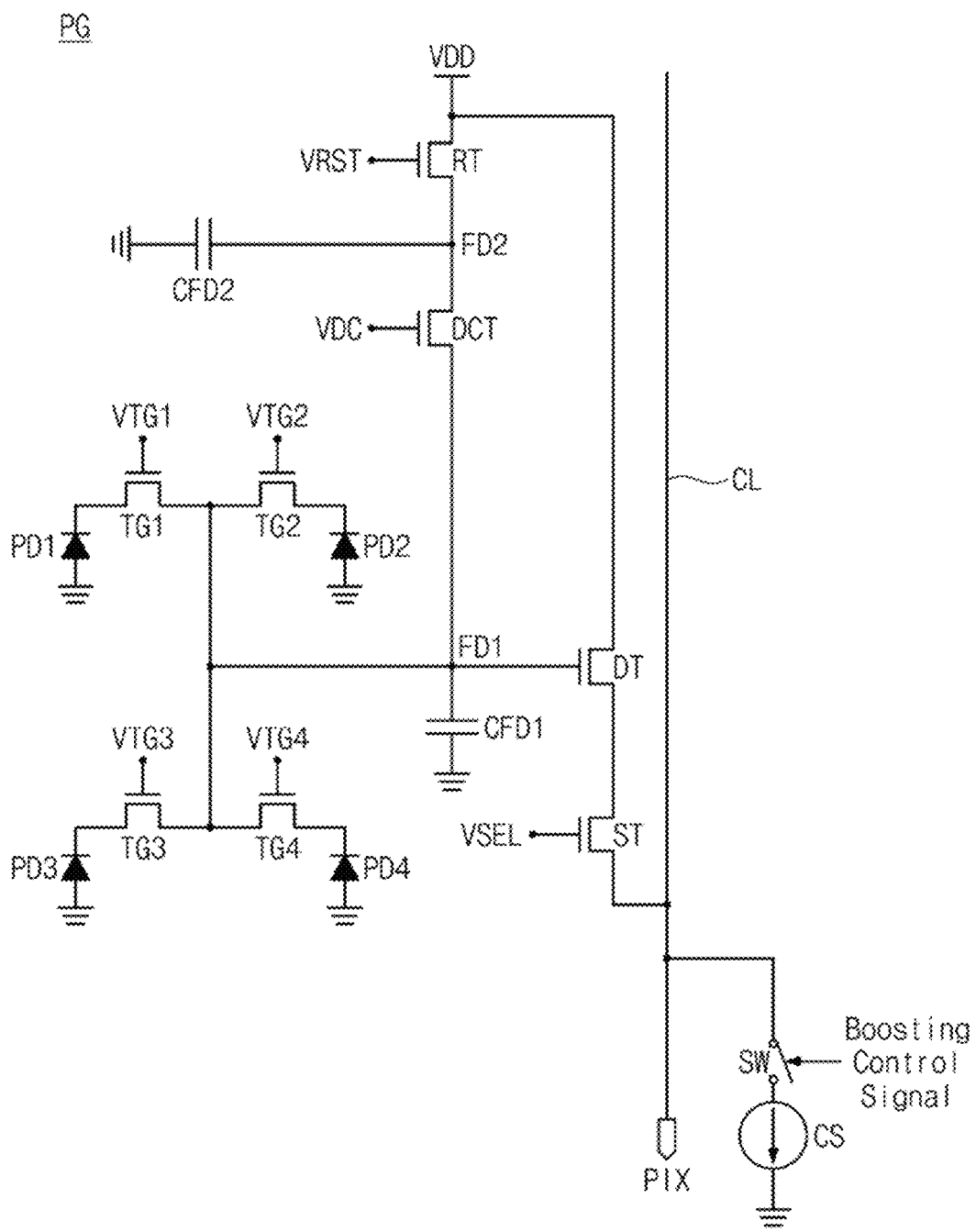
FIG. 3 illustrates a circuit diagram of a pixel group of FIG. 2 according to some example embodiments of the present inventive concepts.

FIG. 3 illustrates a circuit diagram of a pixel group PG of FIG. 2. The pixel group PG may include photoelectric conversion elements PD1 to PD4, transfer transistors TG1 to TG4, a dual conversion transistor DCT, a reset transistor RT, a driving transistor DT, and a selection transistor ST. A switch SW and a current source CS for controlling the boosting of the pixel signal PIX are illustrated together with the components of the pixel group PG. The current source CS may, for example, discharge charges of a column line (e.g., the first column line CL1) and the switch SW may connect (e.g., selectively connect, based on operation of the switch SW) the column line (e.g., the first column line CL1) and the current source CS. For example, the switch SW and the current source CS may be provided as components of (e.g., may be included in) the analog-to-digital converter 130 (refer to FIG. 2) or may be provided outside the analog-to-digital converter. Accordingly, the switch SW and current source CS may be included in a "read circuit" as described herein and/or the read circuit may be understood to be configured to implement the functionality of the current source CS (e.g., discharge charges of a first column line CL1) and the switch (e.g., connect the first column line CL1 and the current source CS).

Referring back to FIG. 3, each of the analog-to-digital converters 130 (e.g., 130_1 to 130_n) may include a separate current source CS and switch SW. For example, the analog-to-digital converters 130 may include a first analog-to-digital converter 130_1 that includes a first current source CS configured to discharge charges of the first column line CL1 and a first switch SW configured to connect the first column line CL1 and the first current source CS, and the analog-to-digital converters 130 may further include a second analog-to-digital converter 130_2 that includes a second current source CS configured to discharge charges of the second column line CL2 and a second switch SW configured to connect the second column line CL2 and the second current source CS.

A first pixel may include the first photoelectric conversion element PD1 and the first transfer transistor TG1. A second pixel may include the second photoelectric conversion element PD2 and the second transfer transistor TG2, and each of the remaining pixels may include similar components. The first to fourth pixels may share the dual conversion transistor DCT, the reset transistor RT, the driving transistor DT, the selection transistor ST, and a first floating diffusion region FD1.

The transfer transistors TG1 to TG4 may transfer charges generated (or integrated) by the photoelectric conversion elements PD1 to PD4 to the first floating diffusion region FD1. For example, during a period where the transfer transistor TG1 is turned on by a transfer signal VTG1 received from the row driver 120 (refer to FIG. 2), charges provided from the photoelectric conversion element PD1 may be integrated in the first floating diffusion region FD1. Operations of the transfer transistors TG2 to TG4 may be similar to the operation of the transfer transistor TG1, and thus, charges provided from the photoelectric conversion elements PD2 to PD4 may be integrated in the first floating diffusion region FD1. First ends of the transfer transistors TG1 to TG4 may be respectively connected with the photoelectric conversion elements PD1 to PD4, and second ends thereof may be connected in common with the first floating diffusion region FD1.

The first floating diffusion region FD1 may integrate charges converted by at least one of the photoelectric conversion elements PD1 to PD4. In some example embodiments, a capacitance of the first floating diffusion region FD1 is depicted as a first capacitance CFD1. The first floating diffusion region FD1 may be connected with a gate terminal of the driving transistor DT that operates as a source follower amplifier. As a result, a voltage potential corresponding to the charges integrated at the first floating diffusion region FD1 may be formed.

The reset transistor RT may be turned on by a reset signal VRST and may provide a reset voltage (e.g., a power supply voltage VDD) to the first floating diffusion region FD1. As a result, the charges integrated in the first floating diffusion region FD1 may move to a terminal for the power supply voltage VDD, and a voltage of the first floating diffusion region FD1 may be reset.

The driving transistor DT may amplify a change of an electrical potential of the first floating diffusion region FD1 and may generate a voltage (i.e., the pixel signal PIX) corresponding to a result of the amplification. The selection transistor ST may be driven by a selection signal VSEL and may select a pixel to be read in units of a row. As the selection transistor ST is turned on, the pixel signal PIX may be output through a column line CL.

Meanwhile, in a general environment, because the first floating diffusion region FD1 is not easily saturated, there is no need to increase the capacitance (i.e., CFD1) of the first floating diffusion region FD1. However, in a high-illuminance environment, the first floating diffusion region FD1 may be easily saturated. Accordingly, to reduce or prevent the saturation, the dual conversion transistor DCT may be turned on such that the first floating diffusion region FD1 and a second floating diffusion region FD2 are electrically connected. In this case, a capacitance of the floating diffusion regions FD1 and FD2 may be expanded to a sum of the first capacitance CFD1 and a second capacitance CFD2.

In addition, although not illustrated in FIG. 3, the second floating diffusion region FD2 may be electrically connected with a floating diffusion region of an adjacent pixel group (not illustrated) through a connecting line (not illustrated). In this case, the capacitance of the first floating diffusion region FD1 may be further expanded. To this end, the pixel group PG may further include a switching element (e.g., an element such as the dual conversion transistor DCT) for electrically connecting the second floating diffusion region FD2 with the floating diffusion region of the adjacent pixel group.

In some example embodiments, in the case where an image processing device operates in a normal mode, the pixel signals PIX output from pixels constituting the pixel group PG may be individually used. That is, the timing controller 140 (refer to FIG. 2) may independently control the transfer signals VTG1 to VTG4 such that the transfer transistors TG1 to TG4 are respectively turned on at different timings, and thus, the pixel signals PIX corresponding to charges converted by the photoelectric conversion elements PD1 to PD4 may be output through the column line CL at different timings.

In some example embodiments, in the case where the image sensor 100 operates in a binning mode, the charges converted by the pixels PX1 to PX4 (refer to FIG. 12) constituting the pixel group PG may be simultaneously used to generate one pixel signal PIX. For example, as the transfer transistors TG1 to TG4 are turned on at the same time or at different timings, the charges converted by the pixels PX1 to PX4 may be integrated in the first floating diffusion region FD1, and the pixel signal PIX corresponding to a sum of the charges converted by the pixels PX1 to PX4 may be output through the column line CL.

Meanwhile, a potential of the column line CL may increase due to the coupling between the transfer transistors TG1 to TG4 and the column line CL or due to the coupling between the reset transistor RT and the column line CL. In this case, the current source CS and the switch SW may be used to quickly decrease the increased potential of the column line CL. For example, the pixel boosting controller 160 (refer to FIG. 2) may generate a boosting control signal for controlling the switch SW, and a potential of the column line CL may be controlled when the switch SW is turned on by the boosting control signal. Accordingly, the pixel boosting controller 160, and thus a read circuit as described herein that includes and/or implements the functionality of the pixel boosting controller 160, may be configured to control the switch SW (e.g., control the switching operation and/or switch position of the switch SW).

Figure 4:
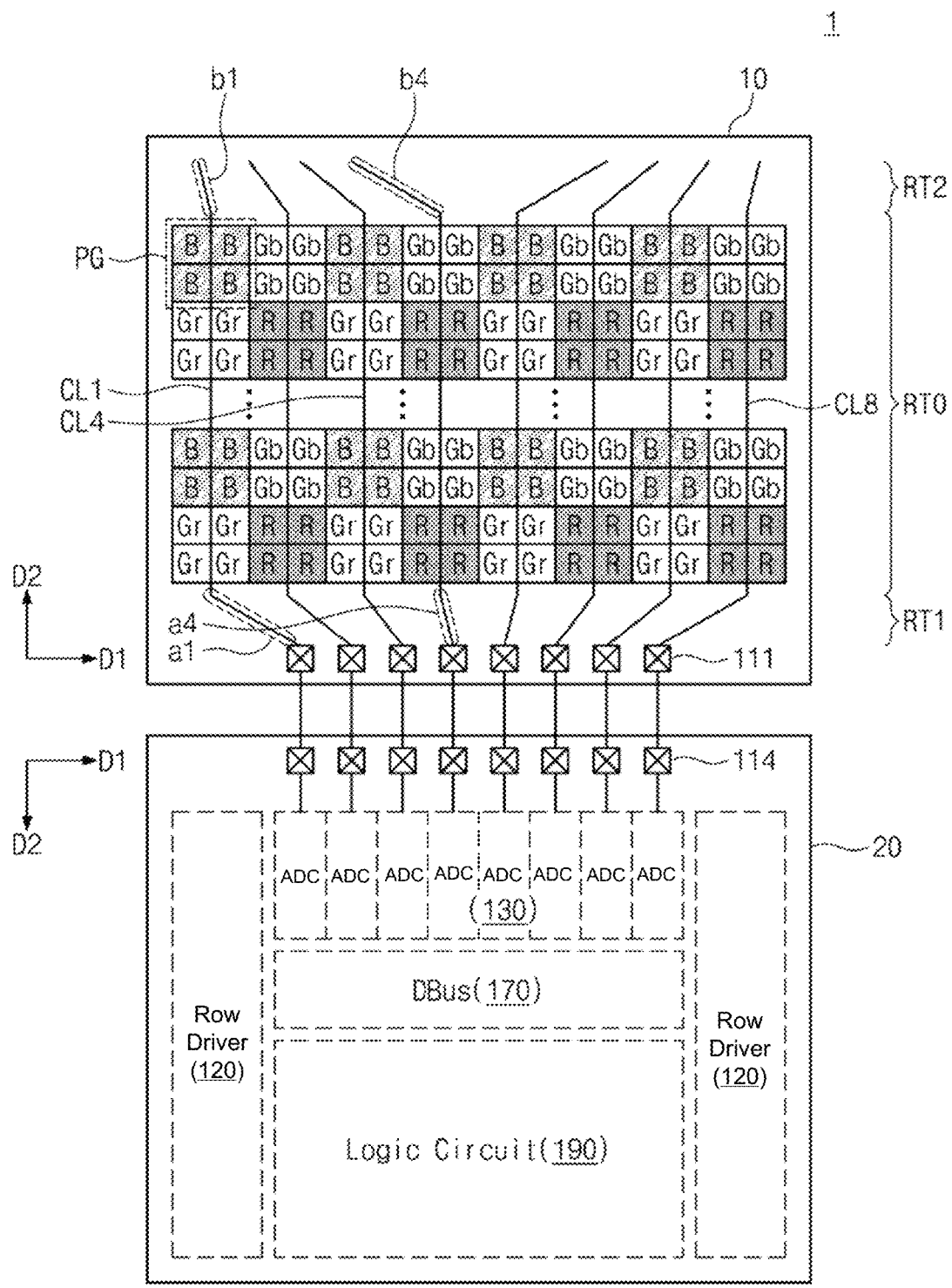
FIG. 4 illustrates a plan view of an image sensor according to some example embodiments of the present inventive concepts.
Figure 5:
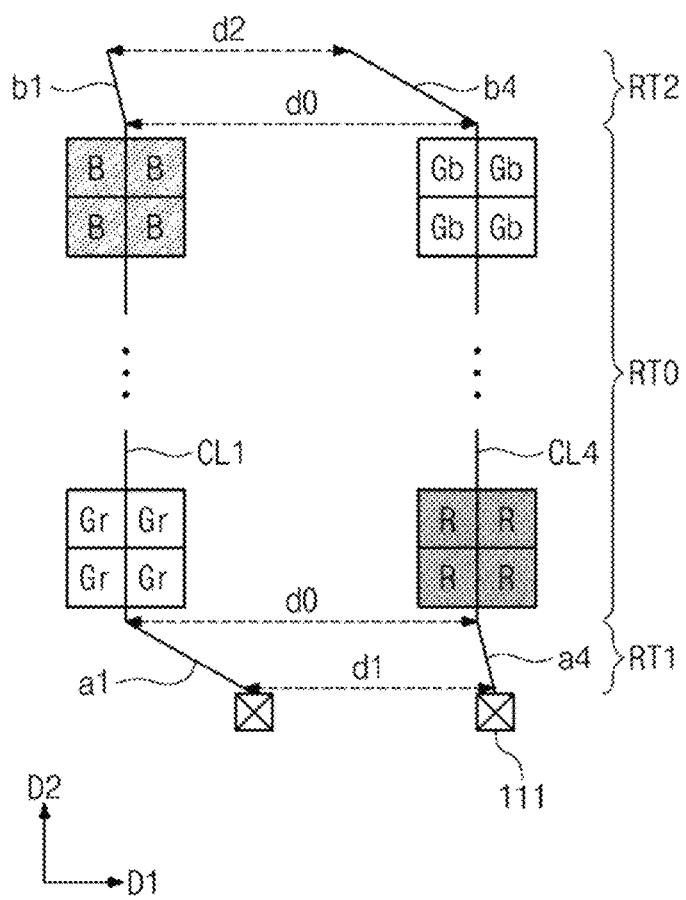
FIG. 5 illustrates a configuration of column lines of an image sensor of FIG. 4 in detail according to some example embodiments of the present inventive concepts.

FIG. 4 illustrates a plan view of an image sensor according to the present inventive concepts. FIG. 5 illustrates a configuration of column lines CL1 and CL4 of an image sensor of FIG. 4 in detail. In some example embodiments, a top plate and a bottom plate of the image sensor 1 of FIG. 1 are illustrated in FIG. 4, and an example in which a pixel array includes 8 column lines CL1 to CL8 is illustrated in FIG. 4. Also, an example in which the first interlayer connection region 111 and the fourth interlayer connection region 114 are electrically connected through 8 wires and the fourth interlayer connection region 114 and the analog-to-digital converters 130 are electrically connected through 8 wires is illustrated in FIG. 4. At least some of the elements shown in FIG. 4, for example the column lines and the analog-to-digital converters 130, may correspond to similar elements shown in at least FIG. 1, FIG. 2, and/or FIG. 3. Below, a configuration of the spider routing of the present inventive concepts will be described with reference to FIGS. 4 and 5 together.

In some example embodiments, the column lines CL1 to CL4 may be arranged across a main routing region RT0, a first routing region RT1, and a second routing region RT2. In the placement of the first column line CL1, a main wire of the first column line CL1, which extends in a second direction D2, may be disposed in the main routing region RT0. A first wire a1 of the first column line CL1 may be connected between one end of the main wire in the first routing region RT1 and the first interlayer connection region 111. A second wire b1 of the first column line CL1 may be connected with an opposite end of the main wire in the second routing region RT2. For example, and as shown in at last FIG. 4, the first column line CL1 may include a main wire extending in a second direction D2 perpendicular to the first direction D1, a first wire a1 between one end of the main wire of the first column line CL1 and the first interlayer connection region 111, and a second wire b1 connected with an opposite end of the main wire of the first column line CL1. As in the above description, any other column line (e.g., CL4) may include a main wire disposed in the main routing region RT0, a first wire a4 disposed in the first routing region RT1, and a second wire b4 disposed in the second routing region RT2. For example, as shown in at least FIG. 4, the fourth column line CL4 (which may in some example embodiments be interchangeably referred to as a second column line of the pixel array 110) may include a main wire of the fourth column line CL4 that extends in the second direction D2, a first wire a4 of the fourth column line CL4 that is between one end of the main wire of the fourth column line CL4 and the first interlayer connection region 111, and a second wire b4 of the fourth column line CL4 that is connected with an opposite end of the main wire of the fourth column line CL4. As shown in at least FIGS. 4-5, the first column line CL1, second column line CL2, and the like (e.g., CL1 to CL8) may be spaced from each other (e.g., isolated from direct contact with each other) in the first direction D1. As further shown, the column lines CL1 to CL8 are connected with the first interlayer connection region 111.

In some example embodiments, as a length of the first wire a1 of a specific column line (e.g., CL1) increases, a length of the second wire b1 may decrease; as a length of the first wire a1 decreases, a length of the second wire b1 may increase. Lengths of the column lines CL1 and CL4 may become equal to each other through second wires (e.g., b1 and b4) disposed in the second routing region RT2. Restated, in some example embodiments a length of the first column line CL1 and a length of the fourth column line CL4 (which may be referred to herein in some example embodiments as a second column line) may be equal to each other. As a result, resistance values of the column lines CL1 and CL4 may become equal to each other, and capacitance values thereof may also become equal to each other. As a result, because time constants of the column lines CL1 and CL4 become equal to each other, a settling time of a pixel signal output through the first column line CL1 and a settling time of a pixel signal output through the fourth column line CL4 may become equal to each other. This may be identically applied to the remaining column lines CL2, CL3, and CL5 to CL8.

As shown in at least FIG. 5, a length of the first wire a1 of the first column line CL1 may be greater than a length of the first wire a4 of the fourth column line CL4 (which may be referred to herein as a second column line). As further shown in at least FIG. 5, a length of the second wire b1 of the first column line CL1 may be smaller than a length of the second wire b4 of the fourth column line CL4.

In some example embodiments, a distance d0 between main wires of two column lines (e.g., CL1 and CL4) may be greater than a distance between the first wires a1 and a4 of the two column lines CL1 and CL4. In detail, a distance d0 between a point where the main wire and the first wire a1 of the column line CL1 contact each other and a point where the main wire and the first wire a4 of the column line CL4 contact each other may be greater than a distance d1 between a point where the first wire a1 of the column line CL1 and the first interlayer connection region 111 contact each other and a point where the first wire a4 of the column line CL4 and the first interlayer connection region 111 contact each other. Restated, and as shown in at least FIG. 5, a first distance (d0) between the main wire of the first column line CL4 and the main wire of the fourth column line CL4 (which may be referred to herein as a second column line of the pixel array 110) may be longer than a second distance (d1) between a point where the first column line CL1 is connected with the first interlayer connection region 111 and a point where the fourth column line CL4 is connected with the first interlayer connection region 111. As shown in at least FIG. 5, a third distance (d2) between a point where the second wire b1 of the first column line CL1 ends and a point where the second wire b4 of the fourth column line CL4 ends is smaller than the first distance (d0).

In some example embodiments, the distance d0 between the main wires of the two column lines CL1 and CL4 may be greater than a distance between the second wires b1 and b4 of the two column lines CL1 and CL4. In detail, a distance d0 between a point where the main wire and the second wire b1 of the column line CL1 contact each other and a point where the main wire and the second wire b4 of the column line CL4 contact each other may be greater than a distance d2 between a point where a routing of the second wire b1 of the column line CL1 ends and a point where a routing of the second wire b4 of the column line CL4 ends. For example, the distance d1 may be equal to or different from the distance d2. For example, the "second distance" d1 as described herein and the "third distance" d2 as described herein with reference to the first column line CL1 and the fourth column line CL4 may be equal (e.g., may be equal in magnitude).

Figure 6A:
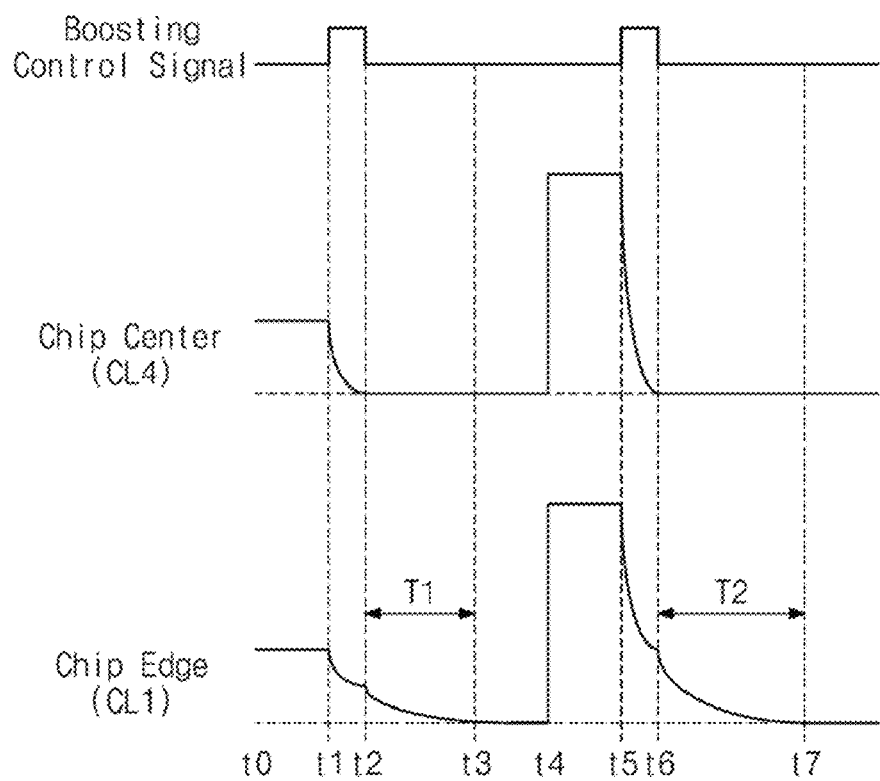
FIGS. 6A, 6B, and 6C illustrate outputs of pixel signals according to locations of column lines according to some example embodiments of the present inventive concepts.
Figure 6B:
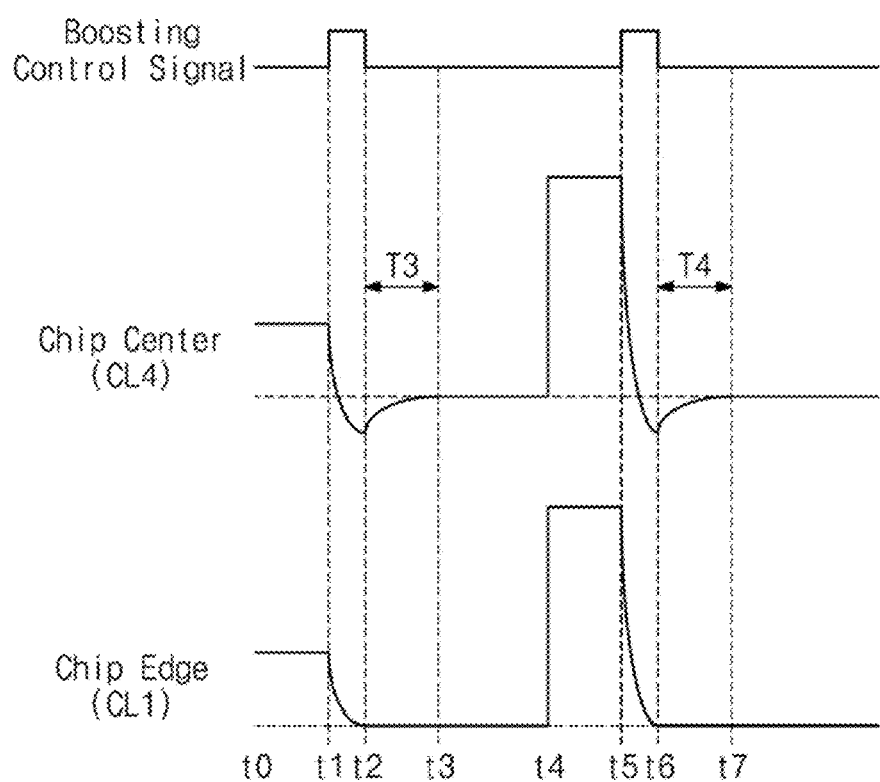
Figure 6C:
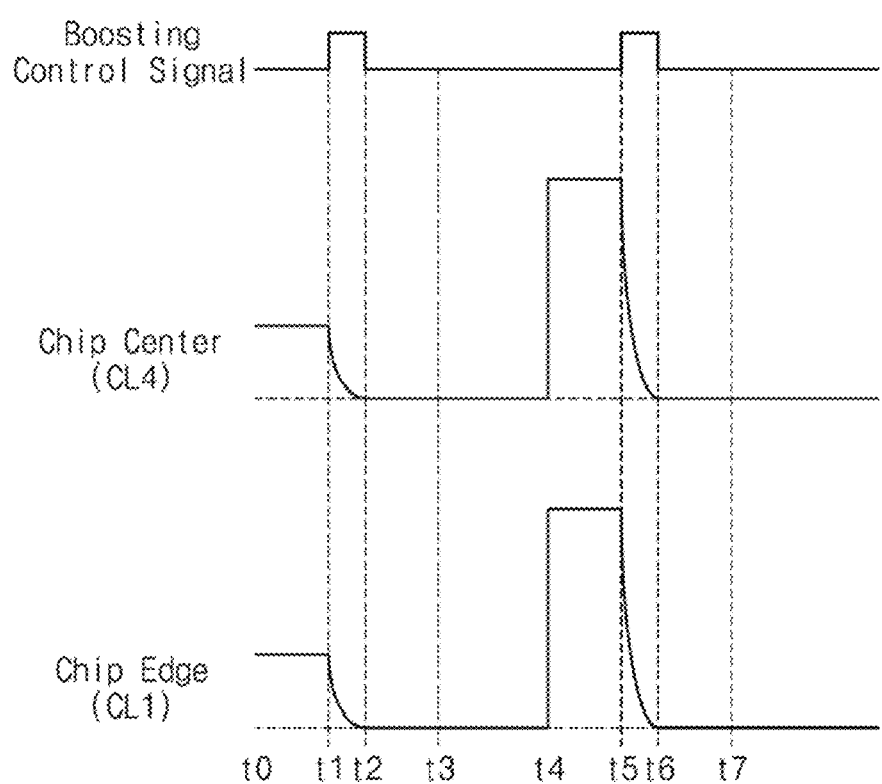

FIGS. 6A, 6B, and 6C illustrate outputs of pixel signals according to locations of column lines. In detail, FIGS. 6A and 6B illustrate outputs of pixel signals in the case where wires (e.g., b1 and b4 of FIG. 5) are not provided in the second routing region RT2 (refer to FIG. 5), unlike the present inventive concepts, and FIG. 6C illustrates an output of a pixel signal in the case where wires (e.g., b1 and b2 of FIG. 5) are provided in the second routing region RT2 (refer to FIG. 5) of the present inventive concepts.

First, referring to FIGS. 1 to 5 and 6A, to control a voltage due to the coupling between the transfer transistors TG1 to TG4 and a column line, the pixel boosting controller 160 may apply the boosting control signal to the switch SW from t1 to t2. To control a voltage due to the coupling between the reset transistor RT and the column line, the pixel boosting controller 160 may apply the boosting control signal to the switch SW from t5 to t6.

However, in the case where the pixel boosting controller 160 is optimized to settle a pixel output of a column line (e.g., CL4) disposed at the center of the pixel array 110, like a graph illustrated in FIG. 6A, there may be a problem for a settling time of a column line (e.g., CL1) disposed at an edge of the pixel array 110.

In detail, because a time constant of a pixel output of the first column line CL1 is greater than a time constant of a pixel output of the fourth column line CL4, even though the time period from t1 to t2 where the first boosting control signal is applied is elapsed, the pixel output of the first column line CL1 may not be completely settled. For this reason, an additional time T1 from t2 to t3 may be further required to completely settle the pixel output of the first column line CL1. As in the above description, even though the time period from t5 to t6 where the second boosting control signal is applied is elapsed, because the pixel output of the first column line CL1 is not completely settled, an additional time T2 from t6 to t7 may be further required to completely settle the pixel output of the first column line CL1.

On the other hand, in the case where the pixel boosting controller 160 is optimized to settle a pixel output of a column line (e.g., CL1) disposed at an edge of the pixel array 110, like a graph illustrated in FIG. 6B, there may be a problem for a settling time of a column line (e.g., CL4) disposed at the center of the pixel array 110.

In detail, because a time constant of a pixel output of the fourth column line CL4 is smaller than a time constant of a pixel output of the first column line CL1, when the time period from t1 to t2 where the first boosting control signal is applied is elapsed, the pixel output of the fourth column line CL4 may be excessively discharged. Accordingly, an additional time T3 from t2 to t3 may be further required to completely settle the pixel output of the fourth column line CL4. As in the above description, when the time period from t5 to t6 where the second boosting control signal is applied is elapsed, because the pixel output of the fourth column line CL4 is excessively discharged, an additional time T4 from t6 to t7 may be further required to completely settle the pixel output of the fourth column line CL4.

As a result, in the case where lengths of column lines of the pixel array 110 are different, the additional times T1 and T2 may be further required to completely settle the column line CL1 disposed at the edge of the pixel array 110, or the additional times T3 and T4 may be further required to completely settle the column line CL4 disposed at the center of the pixel array 110. This may mean that the performance of an image sensor is reduced.

However, according to some example embodiments of the present inventive concepts, second wires may be disposed in the second routing region RT2 such that time constants of column lines become equal to each other, and an additional time for completely settling a pixel output is not required regardless of the optimization of the pixel boosting controller 160 for a pixel output of a specific column line. For example, referring to FIG. 6C, pixel outputs of the column lines CL1 and CL4 may be completely settled at t2 by the boosting control signal applied from t1 to t2, and pixel outputs of the column lines CL1 and CL4 may be completely settled at t6 by the boosting control signal applied from t5 to t6. Accordingly, a time period from t2 to t4 may further decrease, and thus, an operating speed of an image sensor may be improved.

Figure 7:
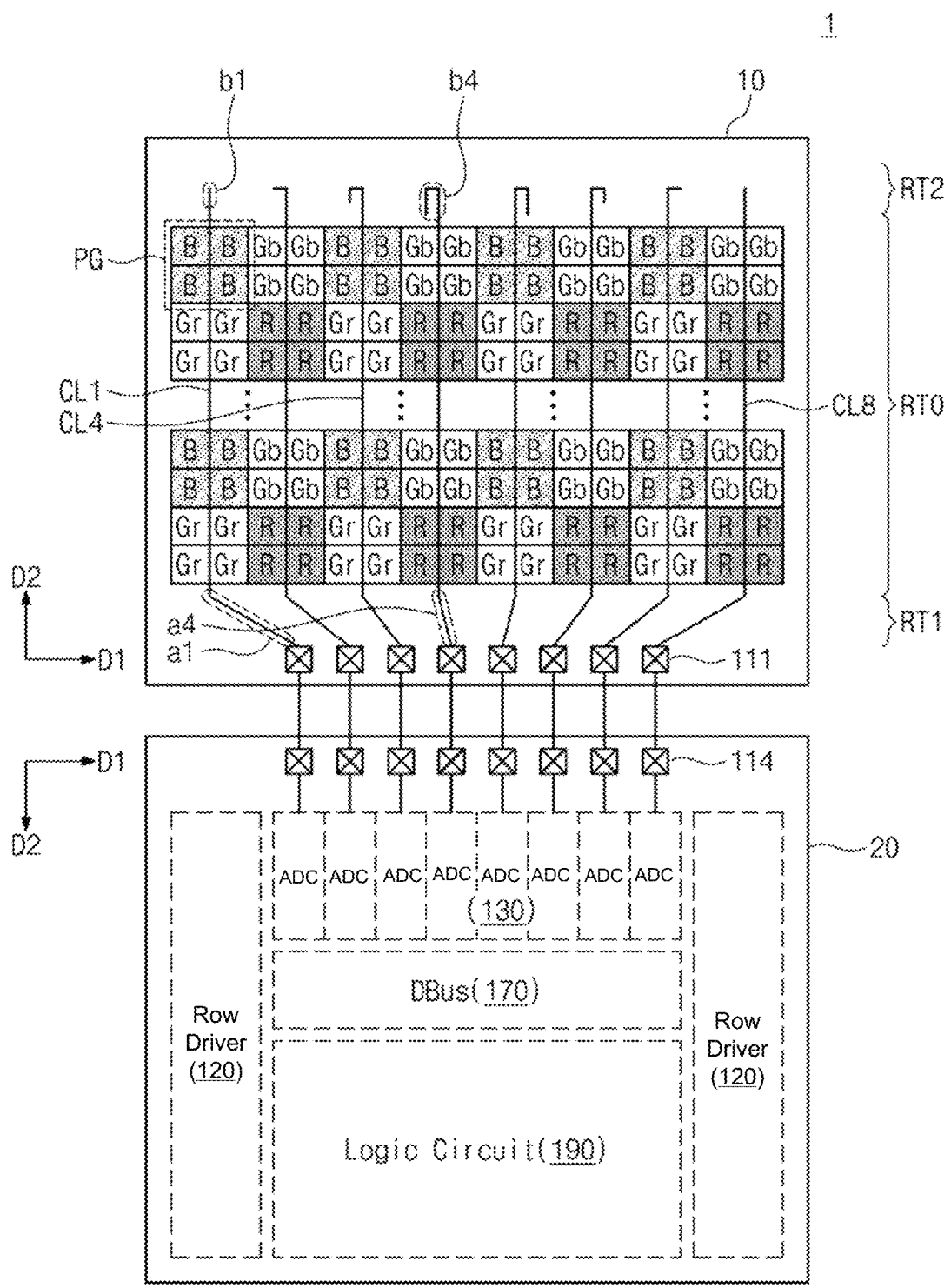
FIG. 7 illustrates a plan view of an image sensor according to some example embodiments of the present inventive concepts.

FIG. 7 illustrates a plan view of an image sensor according to the present inventive concepts. As in the above description given with reference to FIG. 4, the top plate and the bottom plate of the image sensor 1 of FIG. 1 are illustrated in FIG. 7, and an example in which a pixel array includes 8 column lines CL1 to CL8 is illustrated in FIG. 7.

In some example embodiments, the first column line CL1 may include the first wire a1 connected with the first interlayer connection region 111 and may further include the second wire b1. For example, the second wire b1 may extend in a straight line along the second direction D2. The fourth column line CL4 may further include the second wire b4 in addition to the first wire a4 connected with the first interlayer connection region 111. For example, the second wire b4 may be disposed to form two right angles. Here, as the second wire b4 is disposed to form two right angles, the second wire b4 of the fourth column line CL4 may have a spiral shape. Time constants of the column lines CL1 and CL4 may become equal to each other through the second wires b1 and b4 respectively disposed at opposite ends of the column lines CL1 and CL4, and settling times of pixel signals output through the column lines CL1 and CL4 may become equal to each other. This may be identically applied to the remaining column lines CL2, CL3, and CL5 to CL8.

Figure 8:
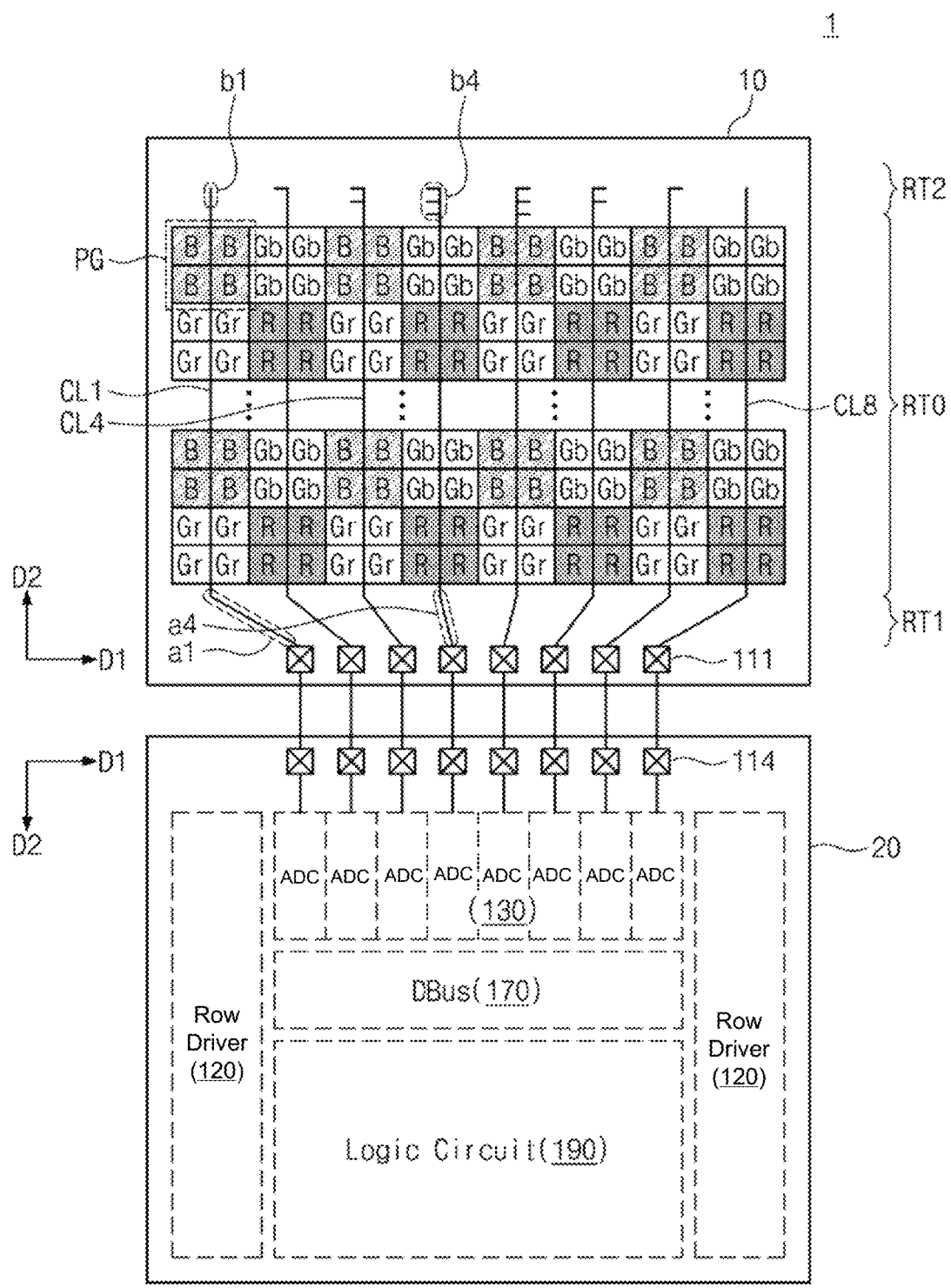
FIG. 8 illustrates a plan view of an image sensor according to some example embodiments of the present inventive concepts.

FIG. 8 illustrates a plan view of an image sensor according to the present inventive concepts. Some example embodiments of FIG. 8 is mostly similar to some example embodiments, including the example embodiments shown in FIGS. 4 and 7, and thus, additional description will be omitted to avoid redundancy.

In some example embodiments, the first column line CL1 may include the first wire a1 connected with the first interlayer connection region 111 and may further include the second wire b1 extending in a straight line along the second direction D2. The fourth column line CL4 may further include the second wire b4 in addition to the first wire a4 connected with the first interlayer connection region 111. For example, the second wire b4 may be disposed to form at least one protrusion. An example in which the second wire b4 includes three protrusions is illustrated in FIG. 8. For example, the protrusion may extend in a direction (e.g., D1) that is different from a direction (i.e., D2) in which the second wire b4 (e.g., a separate portion of the second wire b4, as shown in at least FIG. 8) extends. As in the above description, a second wire of the second column line CL2 is illustrated as including one protrusion, and a second wire of the third column line CL3 is illustrated as including two protrusions. Settling times of pixel signals output through the column lines CL1 to CL4 may become equal to each other by disposing second wires each having one or more protrusions as illustrated in FIG. 8.

Figure 9:
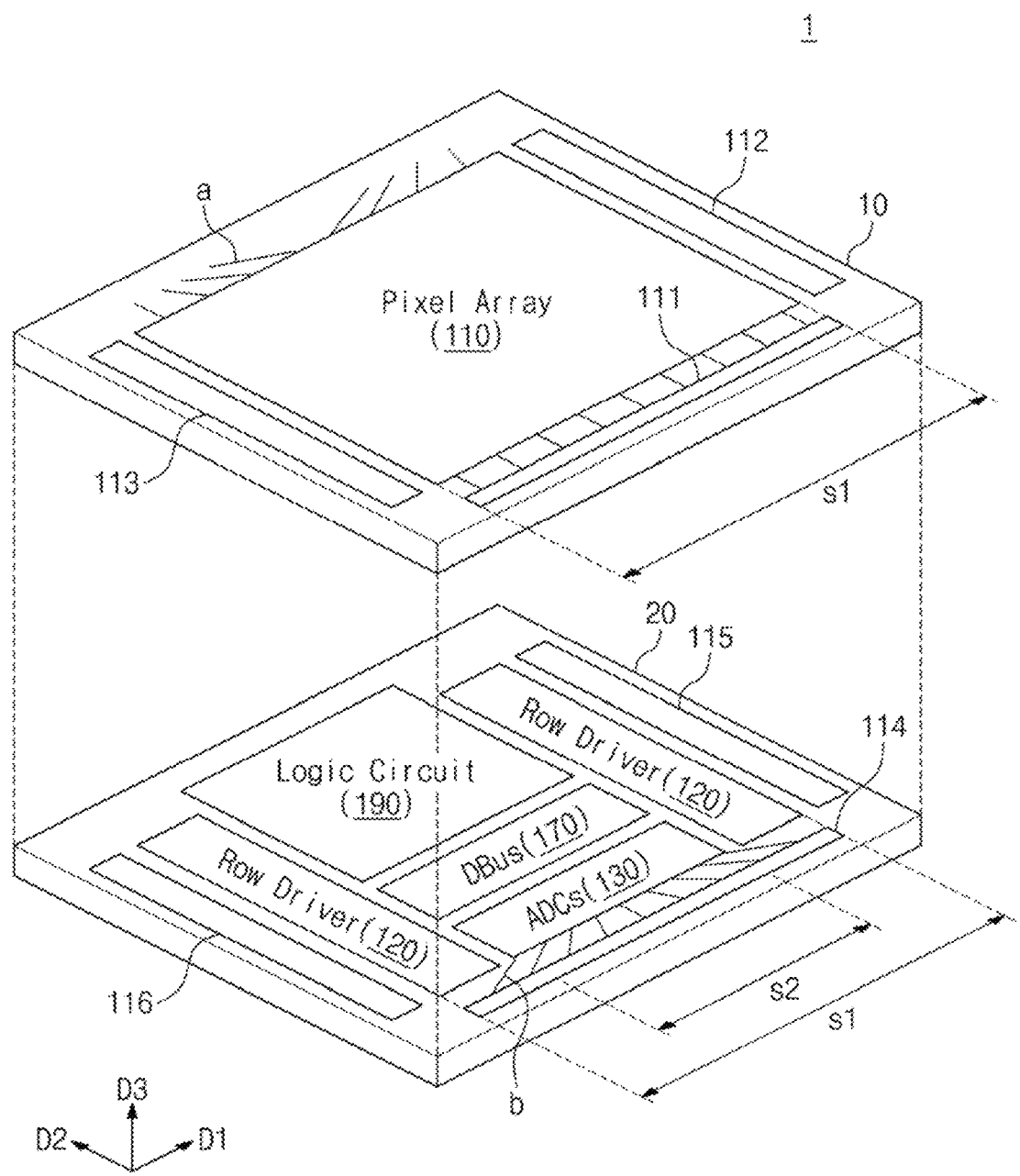
FIG. 9 illustrates a configuration of an image sensor according to some example embodiments of the present inventive concepts.

FIG. 9 illustrates a configuration of an image sensor according to some example embodiments of the present inventive concepts. The image sensor 1 may include the first semiconductor chip 10 and the second semiconductor chip 20. The first semiconductor chip 10 may include the first interlayer connection region 111, the second interlayer connection region 112, the third interlayer connection region 113, and the pixel array 110. The second semiconductor chip 20 may include the fourth interlayer connection region 114, the fifth interlayer connection region 115, the sixth interlayer connection region 116, the row drivers 120, the analog-to-digital converters 130, the data bus 170, and the logic circuit 190. The image sensor 1 of FIG. 9 is mostly similar to the image sensor 1 of FIG. 1, and thus, additional description will be omitted to avoid redundancy.

The pixel array 110 may output a pixel signal, and the output pixel signal may be transmitted to the analog-to-digital converters 130 through the first interlayer connection region 111 and the fourth interlayer connection region 114. Here, unlike some example embodiments, including the example embodiments shown in FIG. 1, a length of the pixel array 110 of the first semiconductor chip 10 in the first direction D1 and a length of the first interlayer connection region 111 in the first direction D1 that are "s1" may be substantially (or mostly) equal to each other. A length of the first interlayer connection region 111 in the first direction D1 and a length of the fourth interlayer connection region 114 in the first direction D1 that are "s1" may be substantially (or mostly) equal to each other. Accordingly, the spider routing may not be formed between the pixel array 110 of the first semiconductor chip 10 and the first interlayer connection region 111.

In some example embodiments, a length s2 of the analog-to-digital converters 130 in the first direction D1 may be smaller than the length s1 of the fourth interlayer connection region 114 in the first direction D1. As a result, lengths of column lines through which pixel outputs of the pixel array 110 are transferred may be different from each other due to differences between column lines associated with a routing "b". For example, a length of a column line disposed at the center of the pixel array 110 may be relatively short, and a length of a column line disposed on a side of the pixel array 110 may be relatively long. Accordingly, the spider routing may be formed on the second semiconductor chip 20.

Figure 10:
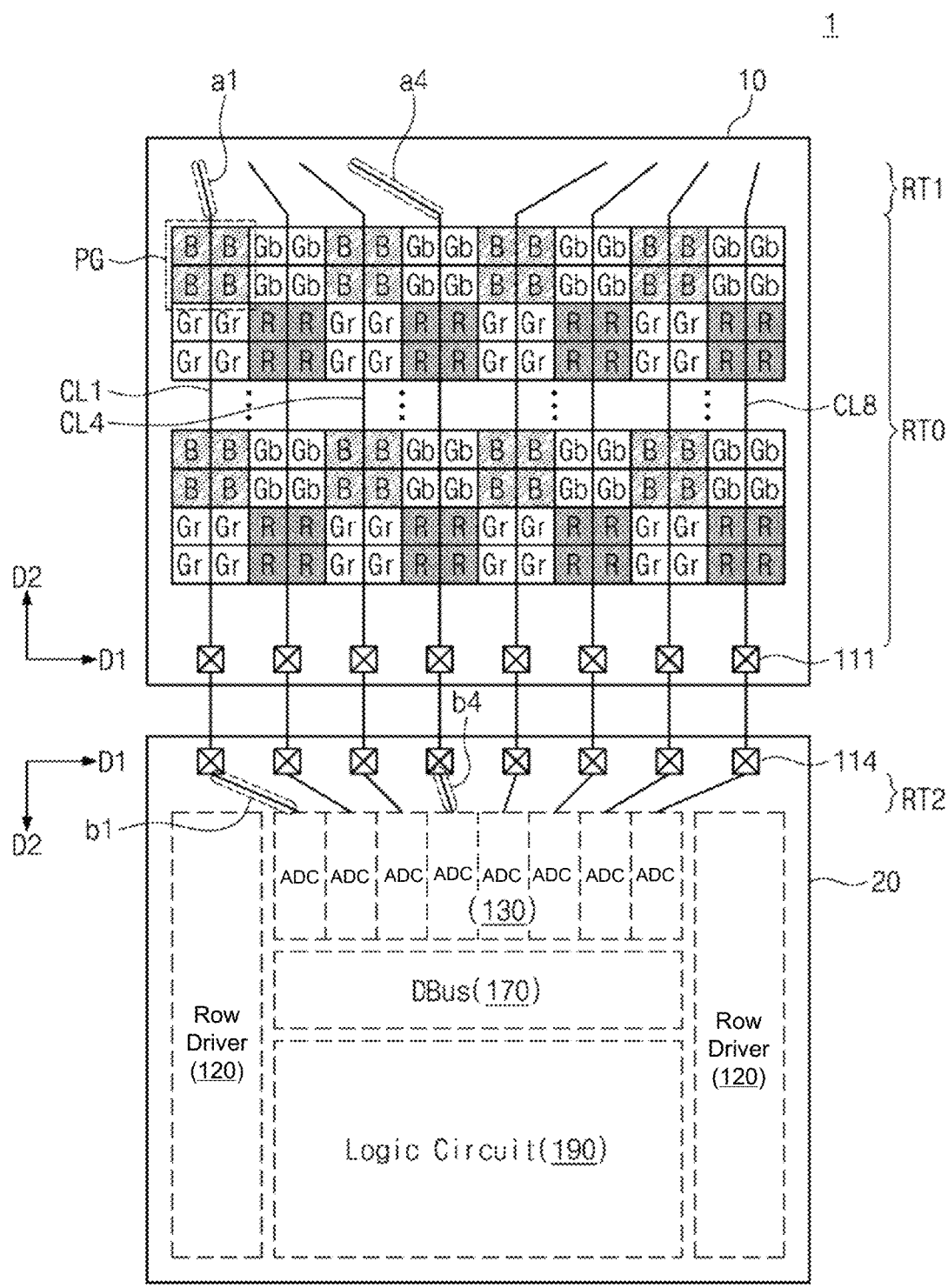
FIG. 10 illustrates a plan view of an image sensor according to some example embodiments of the present inventive concepts.
Figure 11:
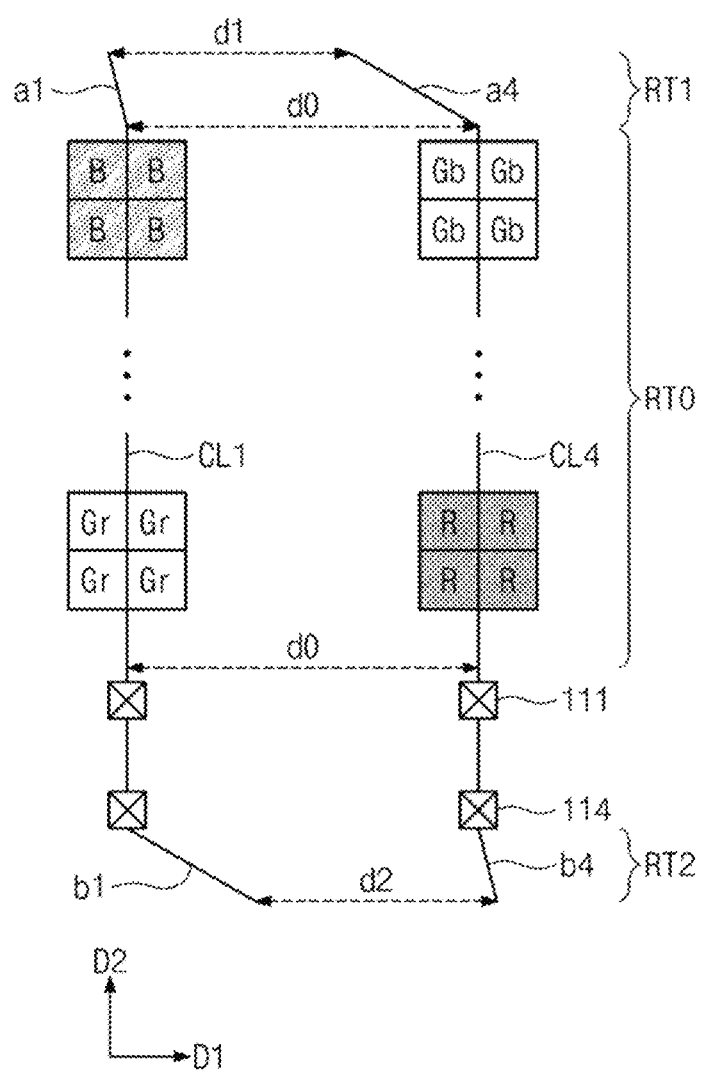
FIG. 11 illustrates a configuration of column lines of an image sensor of FIG. 10 in detail according to some example embodiments of the present inventive concepts.

FIG. 10 illustrates a plan view of an image sensor according to the present inventive concepts. FIG. 11 illustrates a configuration of the column lines CL1 and CL4 of an image sensor of FIG. 10 in detail. In some example embodiments, the top plate and the bottom plate of the image sensor 1 of FIG. 9 are illustrated in FIG. 10, and an example in which a pixel array includes 8 column lines CL1 to CL8 is illustrated in FIG. 10.

In some example embodiments, the first column line CL1 may include a main wire that is disposed in the main routing region RT0 and extends in the second direction D2 and includes one end connected with the first interlayer connection region 111, and a first wire a1 that is disposed in the first routing region RT1 and is connected with an opposite end of the main wire. The fourth column line CL4 (which may be referred to herein in some example embodiments as a second column line) may include a main wire that is disposed in the main routing region RT0 and extends in the second direction D2 and includes one end connected with the first interlayer connection region 111, and a first wire a4 that is disposed in the first routing region RT1 and is connected with an opposite end of the main wire.

In some example embodiments, the fourth interlayer connection region 114 and the analog-to-digital converters 130 may be electrically connected through wires disposed in the second routing region RT2. For example, a wire b1 (also referred to herein as a third wire) may be electrically connected with the first column line CL1 through the interlayer connection regions 111 and 114, and a wire b4 (also referred to herein as a fourth wire) may be electrically connected with the fourth column line CL4 through the interlayer connection regions 111 and 114. The analog-to-digital converters 130 may be configured to process outputs of separate, respective pixels connected to separate, respective column lines. For example, the analog-to-digital converters 130 may include a first analog-to-digital converter configured to process an output of a first pixel that is connected with the first column line CL1, and the analog-to-digital converters 130 may further includes a fourth analog-to-digital converter (also referred to herein as a second analog-to-digital converter) that is configured to process an output of a separate pixel (e.g., second pixel) that is connected with the fourth column line CL4 (which may be referred to herein as a second column line). Additionally, it will be understood that the second semiconductor chip 20 may include the wire b1 (e.g., third wire) that is electrically connected with the first column line CL1 through the first interlayer connection region 111 and the fourth interlayer connection region 114 and is electrically connected with the first analog-to-digital converter of the analog-to-digital converters 130, and the second semiconductor chip 20 may further include the wire b4 (e.g., fourth wire) that is electrically connected with the fourth column line CL4 through the first interlayer connection region 111 and the fourth interlayer connection region 114 and is electrically connected with the fourth analog-to-digital converter of the analog-to-digital converters 130.

In some example embodiments, as a length of the wire b1 increases, a length of the first wire a1 of the first column line CL1 may decrease; as a length of the wire b1 decreases, a length of the first wire a1 may increase. A length of the first wire a1 of the first column line CL1 may be longer than a length of the third wire b1. A length from the first column line CL1 to the fourth interlayer connection region 114 and a length from the fourth column line CL4 to the fourth interlayer connection region 114 may become equal to each other through the first wires (e.g., a1 and a4) disposed in the first routing region RT1. As a result, resistance values of the column lines CL1 and CL4 may become equal to each other, and capacitance values thereof may also become equal to each other. As a result, because time constants of the column lines CL1 and CL4 become equal to each other, a settling time of a pixel signal output through the first column line CL1 and a settling time of a pixel signal output through the fourth column line CL4 may become equal to each other. This may be identically applied to the remaining column lines CL2, CL3, and CL5 to CL8.

In some example embodiments, a distance d0 between main wires of two column lines (e.g., CL1 and CL4) may be greater than a distance between the first wires a1 and a4 of the two column lines CL1 and CL4. In detail, the distance d0 between a point where the main wire and the first wire a1 of the column line CL1 contact each other and a point where the main wire and the first wire a4 of the column line CL4 contact each other, which may equal a first distance between the main wire of the first column line CL1 and the main wire of the fourth column line CL4, may be greater than a distance d1 between a point where a routing of the first wire a1 of the column line CL1 ends and a point where a routing of the first wire a4 of the column line CL4 ends. Restated, a third distance (d1) between a point where the first wire a1 of the first column line CL1 ends and a point where the first wire a4 of the fourth column line CL4 ends may be smaller than the first distance (d0) between the main wire of the first column line CL1 and the main wire of the fourth column line CL4. In some example embodiments, a second distance (d2) between a point where the third wire b1 is connected with the first analog-to-digital converter of the analog-to-digital converters 130 and a third distance between a point where the first wire a1 of the first column line CL1 ends and a point where the first wire a4 of the fourth column line CL4 ends may be equal (e.g., equal in magnitude to each other).

The distance d0 between two column lines (e.g., CL1 and CL4) may be greater than a distance between two wires b1 and b4. In detail, the distance d0 between the column lines CL1 and CL4 (e.g., the distance between the main wire of the first column line CL1 and the main wire of the fourth column line CL4) may be greater than the distance d2 between a point where the second wire b1 and an analog-to-digital converter contact each other (e.g., a point where the third wire b1 is connected with the first analog-to-digital converter of the analog-to-digital converters 130) and a point where the second wire b4 and the analog-to-digital converter contact each other (e.g., a point where the fourth wire b4 is connected with the fourth analog-to-digital converter of the analog-to-digital converters 130). For example, the distance d1 may be equal to or different from the distance d2.

Time constants of the column lines CL1 and CL4 may become equal to each other through the first wires a1 and a4 respectively disposed at opposite ends of the column lines CL1 and CL4. Accordingly, settling times of pixel signals output through the column lines CL1 to CL4 may become equal to each other. Meanwhile, although not separately illustrated in drawings, the wires illustrated in FIGS. 7 and 8 may be implemented by changing or modifying shapes of the wires a1 and a4 illustrated in FIG. 11.

Figure 12:
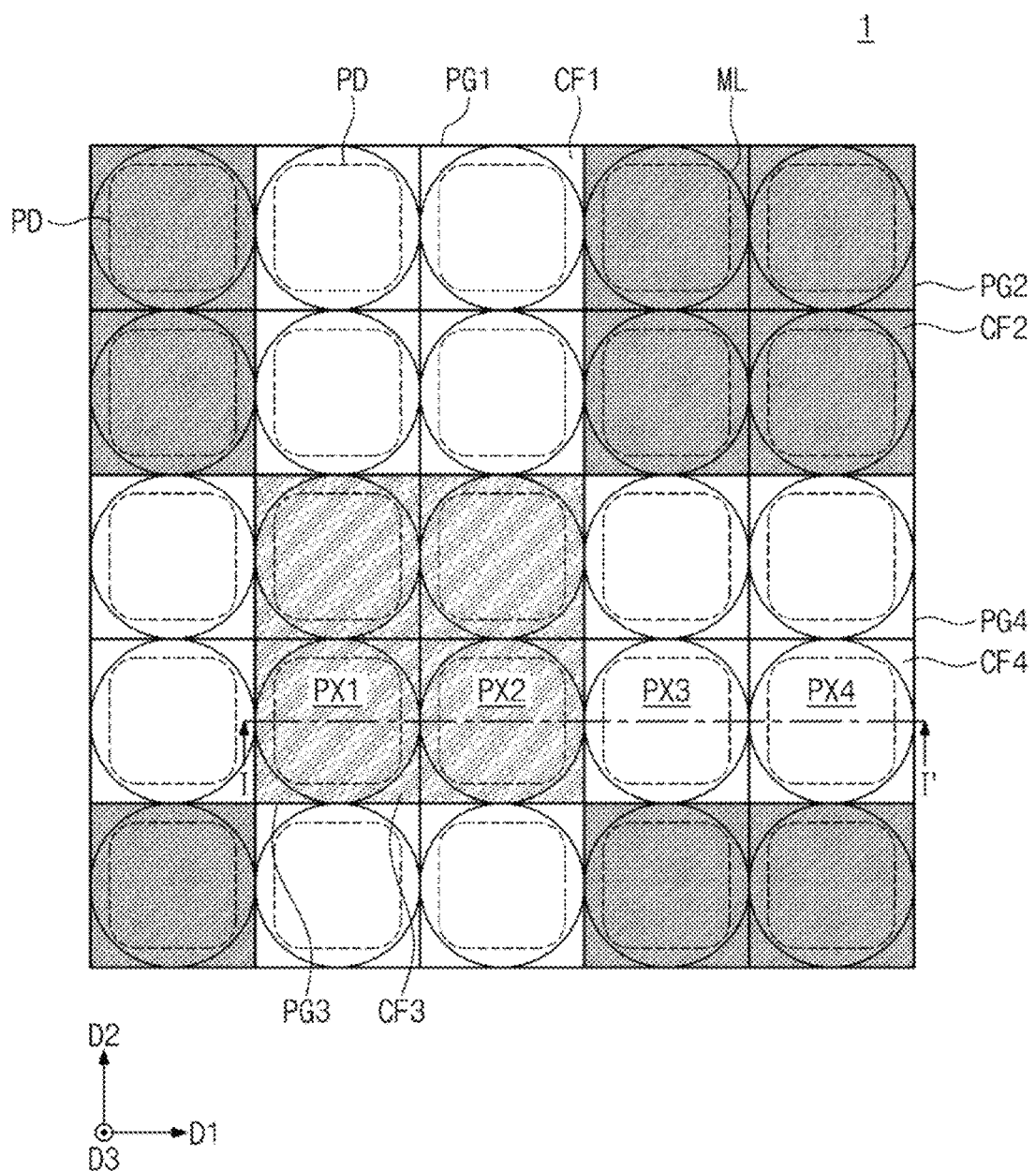
FIG. 12 illustrates a plan view of an image sensor of FIG. 1 or 9 according to some example embodiments of the present inventive concepts.

FIG. 12 illustrates a plan view of an image sensor of FIG. 1 or 9. The image sensor 1 may include pixel groups PG1 to PG4 (e.g., pixel groups PG1, PG2, PG3, and PG4). The pixel groups PG1 to PG4 may be repeatedly formed on a substrate of the image sensor 1 along the first direction D1 and the second direction D2. Each of the pixel groups PG1 to PG4 may include 2×2 pixels arranged along the first direction D1 and the second direction D2. Each pixel may include the photoelectric conversion element PD.

Color filters CF1 to CF4 for passing a light of a specific wavelength band may be respectively formed on the pixel groups PG1 to PG4. For example, the first color filter CF1 and the fourth color filter CF4 may pass a green light, the second color filter CF2 may pass a red light, and the third color filter CF3 may pass a blue light. As illustrated in FIG. 12, the second color filter CF2 may be adjacent to the first color filter CF1 in the first direction D1 and the third color filter CF3 may be adjacent to the fourth color filter CF4 in the first direction D1. That is, the Bayer pattern may be formed. A micro lens ML may be formed on a color filter formed on each pixel.

Figure 13:
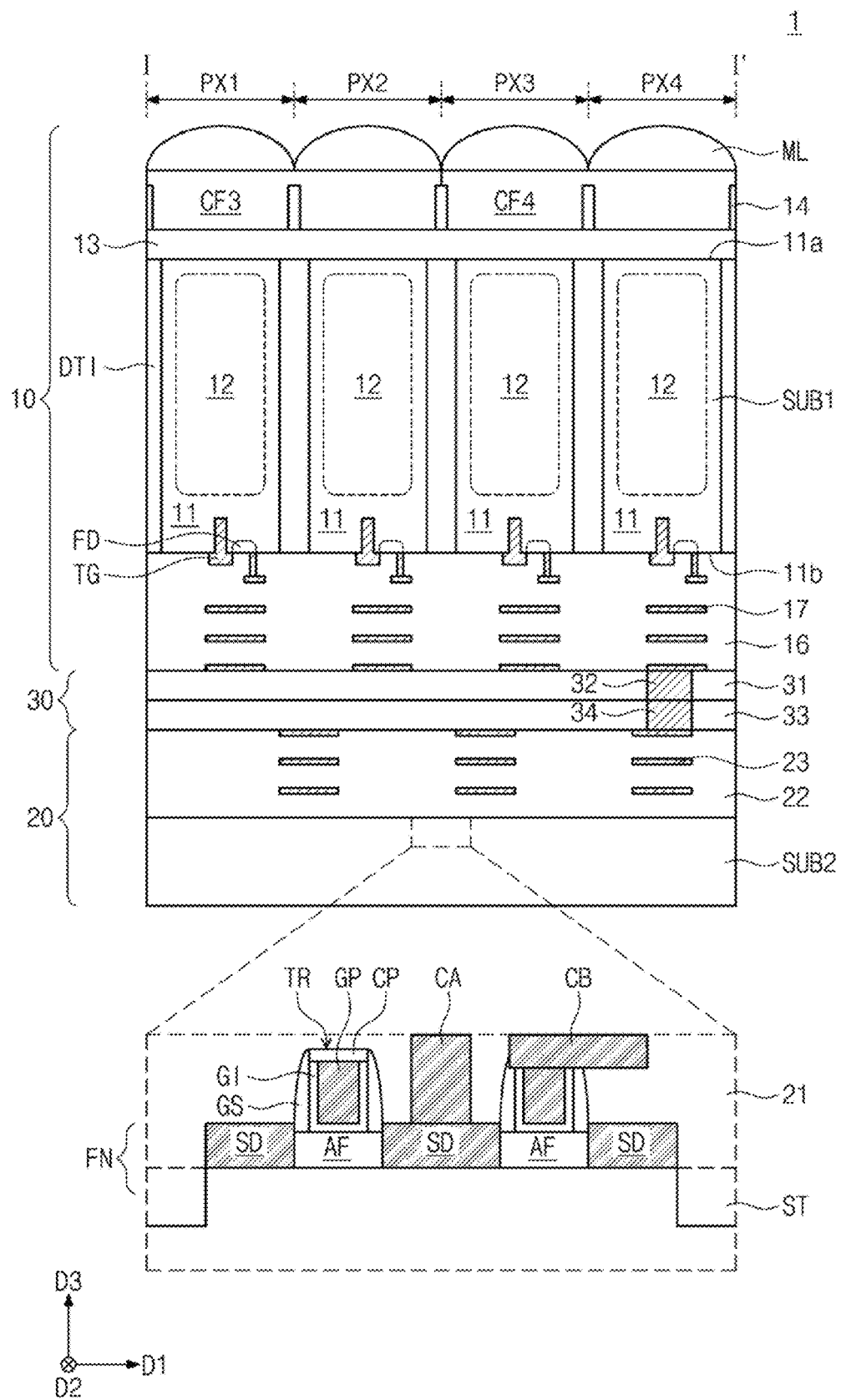
FIG. 13 illustrates a cross-sectional view of an image sensor taken along line I-I' of FIG. 12 according to some example embodiments of the present inventive concepts.

FIG. 13 illustrates a cross-sectional view of an image sensor taken along line I-I' of FIG. 12. The image sensor 1 may include the first semiconductor chip 10 and the second semiconductor chip 20. For example, the first semiconductor chip 10 may correspond to the first semiconductor chip 10 described with reference to FIGS. 1 to 11, and the second semiconductor chip 20 may correspond to the second semiconductor chip 20 described with reference to FIGS. 1 to 11.

The image sensor 1 may include a first substrate SUB1 including a first surface 11a and a second surface 11b facing away from each other. The first substrate SUB1 may include a single crystalline substrate or an epitaxial layer. The first substrate SUB1 may include a region (first doping region 11) doped with impurities of a first conductive type (e.g., P-type) and a region (second doping region 12) doped with impurities of a second conductive type (e.g., N-type). The first doping region 11 and the second doping region 12 may form the photoelectric conversion element PD of each pixel. When a light is incident on the photoelectric conversion element PD through the micro lens ML and a color filter (e.g., one of CF1 to CF4), electron-hoe pairs EHP corresponding to the intensity of absorbed light may be generated.

A fixed charge layer 13 may be formed on the first surface 11a of the first substrate SUB1. The fixed charge layer 13 may include various kinds of metal oxide and/or metal fluoride. For example, the fixed charge layer 13 may include at least one or more of $Al_2O_3$, $HfO_X$ (X being a natural number), $SiO_2$, and SiN. An interlayer insulating layer 16 may be formed on the second surface 11b of the first substrate SUB1. For example, the interlayer insulating layer 16 may include a plurality of insulating layers. The interlayer insulating layer 16 may be covered with a passivation layer (not illustrated). For example, the passivation layer may include a silicon nitride layer.

Meanwhile, each of the pixels PX1 to PX4 may include a floating diffusion region FD and a transfer transistor TG. In addition, although not illustrated for brevity of illustration, each of the pixels PX1 to PX4 may further include a reset transistor, a driving transistor, and a selection transistor. The pixels PX1 to PX4 may be separated from each other by a deep trench isolator (DTI). When a transfer signal is applied to a gate electrode of the transfer transistor TG, the transfer transistor TG may be turned on, and thus, charges generated in the first doping region 11 and the second doping region 12 may move to the floating diffusion region FD. The charges of the floating diffusion region FD may be transferred to the outside (e.g., the second semiconductor chip 20) through internal wires 17 and vias (not illustrated) connecting the internal wires 17.

Separations 14 may be formed on the fixed charge layer 13. The separations 14 may include tungsten, titanium, etc. The separations 14 may reduce or prevent the crosstalk between adjacent pixels. In a plan view, the separations 14 may have a grid shape. The color filters CF1 to CF4 may be formed on the fixed charge layer 13 between the separations 14. The micro lens ML may be formed on the color filters CF1 to CF4.

The image sensor 1 may further include a second substrate SUB2. The image sensor 1 may include transistors TR formed on the second substrate SUB2. The second substrate SUB2 may be a p-type semiconductor substrate (e.g., a silicon substrate, a germanium substrate, or a silicon-germanium substrate) doped with impurities.

The transistors TR formed on the second substrate SUB2 may constitute the logic circuit 190 of FIG. 1 or 9. Active patterns FN may be formed on the second substrate SUB2. Device isolation layers ST that fill spaces between the active patterns FN may be formed. For example, the device isolation layers ST may include a silicon oxide layer. The device isolation layers ST may have a depth in a direction that is opposite to a third direction D3. The third direction D3 may be a direction perpendicular to an upper surface of the second substrate SUB2.

Gate electrodes GP that intersect the active pattern FN and extend in the second direction D2 may be formed on the active pattern FN. The gate electrodes GP may be formed to be spaced from each other (e.g., isolated from direct contact with each other) in the first direction D1. A gate insulating pattern GI may be formed under each gate electrode GP, and gate spacers GS may be formed on opposite sides of each gate electrode GP. In addition, a capping pattern CP covering an upper surface of each gate electrode GP may be formed. An interlayer insulating layer 21 covering the gate electrodes GP may be formed.

The gate electrodes GP may include at least one of doped semiconductor, metal, conductive metal nitride. The gate insulating pattern GI may include a silicon oxide layer or a silicon oxynitride layer or may include a high-k dielectric layer, of which a dielectric constant is higher than that of a silicon oxide layer. Each of the capping pattern CP and the gate spacers GS may include at least one of a silicon oxide layer, a silicon nitride layer, and a silicon oxynitride layer.

Source/drain regions SD may be formed in the active pattern FN so as to be placed at opposite sides of each of the gate electrodes GP. The source/drain regions SD may be p-type or n-type dopant regions. The source/drain regions SD may be epitaxial patterns formed by an epitaxial growth process.

The source/drain regions SD may include a semiconductor element different from that of the second substrate SUB2. For example, the source/drain regions SD may include a semiconductor element that has a lattice constant greater than or smaller than a lattice constant of a semiconductor element of the second substrate SUB2. The source/drain regions SD may include a semiconductor element different from a semiconductor element included in the second substrate SUB2, and thus, a compressive stress or tensile stress may be applied to channel regions AF between the source/drain regions SD.

For example, when the second substrate SUB2 is a silicon substrate, the source/drain regions SD of a P-type MOSFET region may include embedded silicon-germanium (SiGe) or germanium. Here, the source/drain regions SD may provide the compressive stress to the channel regions AF. In some example embodiments, in the case where the second substrate SUB2 is a silicon substrate, the source/drain regions SD of an N-type MOSFET region may include silicon carbide (SiC). As a result, a tensile stress may be applied to the channel regions AF. As a result, mobility of carriers generated in the channel regions AF may be improved.

Source/drain contacts CA may be formed between the gate electrodes GP. The source/drain contacts CA may be directly connected with the source/drain regions SD and may be electrically connected therewith. The source/drain contacts CA may be provided in the interlayer insulating layer 21.

Gate contacts CB may be formed on the interlayer insulating layer 21. Each of the gate contacts CB may be directly connected with the gate electrode GP through the capping pattern CP. A bottom surface of the gate contact CB may be higher than a bottom surface of the source/drain contact CA. In addition, the bottom surface of the gate contact CB may be higher than an upper surface of the source/drain region SD.

An interlayer insulating layer 22 may be formed on the second substrate SUB2. The interlayer insulating layer 22 may include a plurality of insulating layers. A signal processed by the logic circuit (e.g., 190 of FIG. 1) composed of the transistors TR may be transferred to the outside of the image sensor 1 through internal wires 23 and vias (not illustrated) connecting the internal wires 23. Alternatively, charges of the floating diffusion region FD of the first semiconductor chip 10 may be transferred to an analog-to-digital converter (e.g., 130 of FIG. 1) composed of the transistors TR through an insertion layer 30, the internal wires 23, and the vias (not illustrated) connecting the internal wires 23.

The insertion layer 30 may physically and electrically connect the first semiconductor chip 10 and the second semiconductor chip 20. For example, the insertion layer 30 may correspond to a wire that electrically connects the first interlayer connection region 111 and the fourth interlayer connection region 114 illustrated in FIG. 4, and thus an image sensor may include the insertion layer 30 that electrically connects the first interlayer connection region 111 and the fourth interlayer connection region 114.

The insertion layer 30 may include a first insulating layer 31, a first conductive pattern 32, a second insulating layer 33, and a second conductive pattern 34. The conductive patterns 32 and 34 may be in contact with each other to be electrically connected, and the conductive patterns 32 and 34 may electrically connect the internal wires of the first semiconductor chip 10 and the internal wires of the second semiconductor chip 20. The conductive patterns 32 and 34 may be implemented by using a contact of conductive patterns, such as copper or tungsten, a TSV, a BVS, etc. The first conductive pattern 32 and the second conductive pattern 34 may be respectively provided in the first insulating layer 31 and the second insulating layer 33. For example, the first insulating layer 31 and the second insulating layer 33 may include a silicon oxide layer.

In addition, the insertion layer 30 may further include metal diffusion prevention layers (not illustrated) respectively provided between the first semiconductor chip 10 and the first insulating layer 31, between the first insulating layer 31 and the second insulating layer 33, and between the second insulating layer 33 and the second semiconductor chip 20. In this case, the metal diffusion prevention layers may include SiN, SiCN, SiOCN, SiON, or SiC. The metal diffusion prevention layers may reduce or prevent diffusion of a metallic component from the conductive patterns 32 and 34.

Figure 14:
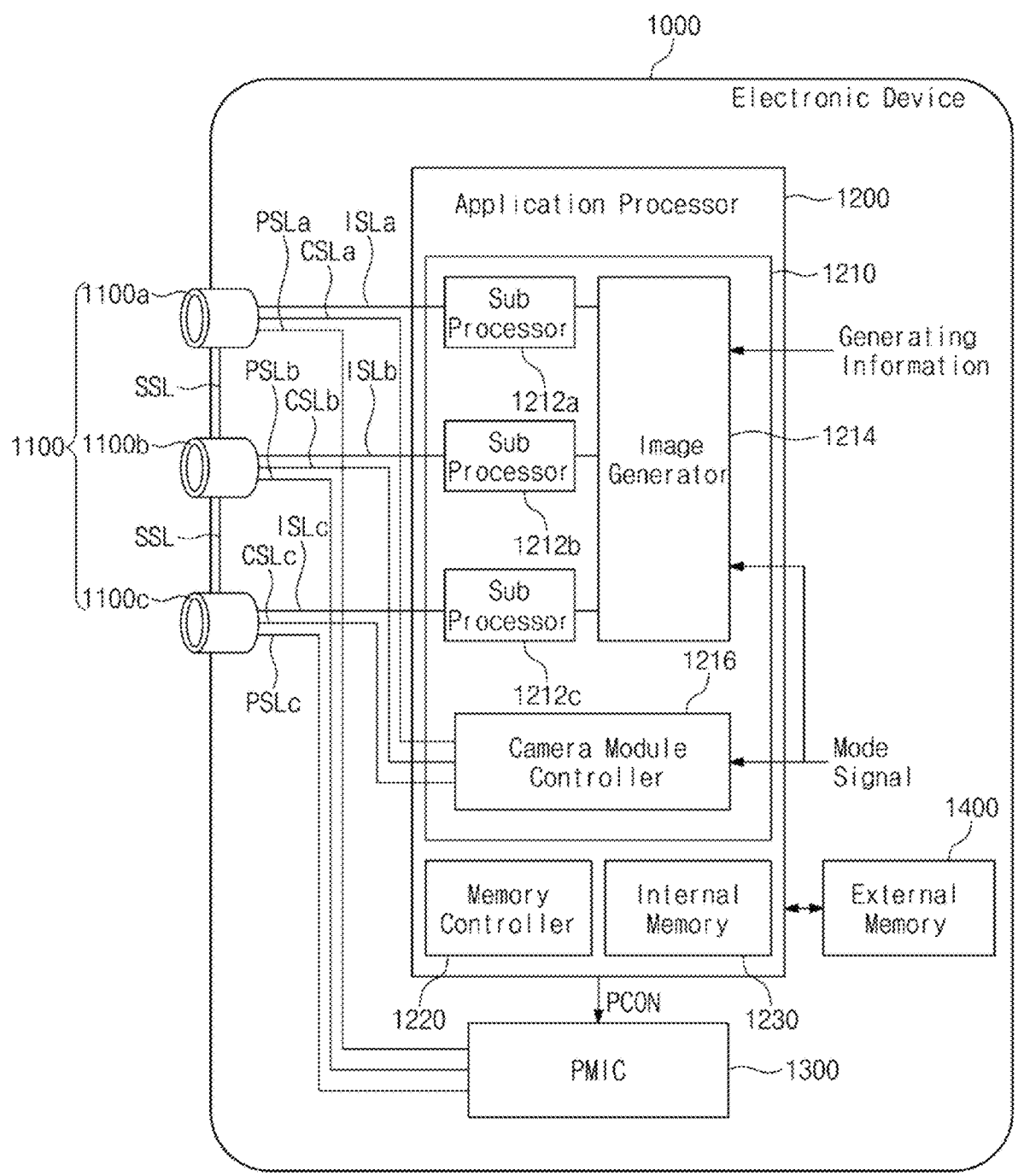
FIG. 14 illustrates a configuration of an electronic device including a camera module to which an image sensor of the present inventive concepts is applied according to some example embodiments of the present inventive concepts.
Figure 15:
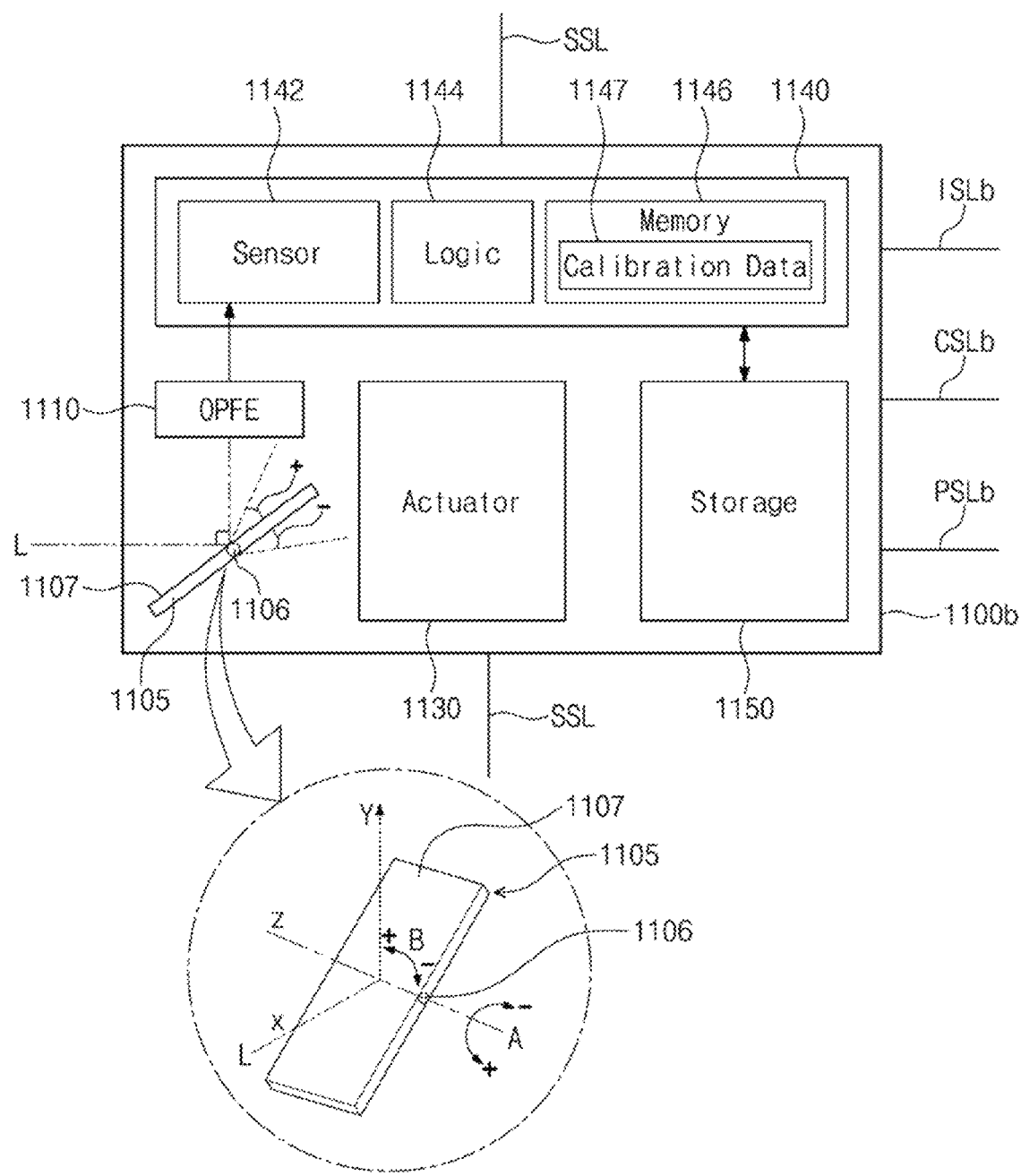
FIG. 15 illustrates a configuration of a camera module of FIG. 14 according to some example embodiments of the present inventive concepts.

FIG. 14 illustrates a configuration of an electronic device including a camera module to which an image sensor of the present inventive concepts is applied. FIG. 15 illustrates a configuration of a camera module of FIG. 14.

Referring to FIG. 14, an electronic device 1000 may include a camera module group 1100, an application processor 1200, a PMIC 1300, and an external memory 1400.

The camera module group 1100 may include a plurality of camera modules 1100a, 1100b, and 1100c. As described herein, any camera module may be interchangeably referred to as a "camera" or "camera device." Some example embodiments in which three camera modules 1100a, 1100b, and 1100c are disposed is illustrated in FIG. 14, but example embodiments are not limited thereto. In some example embodiments, the camera module group 1100 may be modified to include only two camera modules. Also, in some example embodiments, the camera module group 1100 may be modified to include "n" camera modules (n being a natural number of 4 or more).

Below, a detailed configuration of the camera module 1100b will be more fully described with reference to FIG. 15, but the following description may be equally applied to the remaining camera modules 1100a and 1100c.

Referring to FIG. 15, the camera module 1100b may include a prism 1105, an optical path folding element (OPFE) 1110, an actuator 1130, an image sensing device 1140, and storage device 1150.

The prism 1105 may include a reflecting plane 1107 of a light reflecting material and may change a path of a light "L" incident from the outside.

In some example embodiments, the prism 1105 may change a path of the light "L" incident in a first direction "X" to a second direction "Y" perpendicular to the first direction "X", Also, the prism 1105 may change the path of the light "L" incident in the first direction "X" to the second direction "Y" perpendicular to the first direction "X" by rotating the reflecting plane 1107 of the light reflecting material in direction "A" about a central axis 1106 or rotating the central axis 1106 in direction "B". In this case, the OPFE 1110 may move in a third direction "Z" perpendicular to the first direction "X" and the second direction "Y".

In some example embodiments, as illustrated, a maximum rotation angle of the prism 1105 in direction "A" may be equal to or smaller than 15 degrees in a positive A direction and may be greater than 15 degrees in a negative A direction, but embodiments are not limited thereto.

In some example embodiments, the prism 1105 may move within approximately 20 degrees in a positive or negative B direction, between 10 degrees and 20 degrees, or between 15 degrees and 20 degrees; here, the prism 1105 may move at the same angle in the positive or negative B direction or may move at a similar angle within approximately 1 degree.

In some example embodiments, the prism 1105 may move the reflecting plane 1107 of the light reflecting material in the third direction (e.g., a Z direction) parallel to a direction in which the central axis 1106 extends.

The OPFE 1110 may include optical lenses composed of "m" groups (m being a natural number), for example. Here, "m" lens may move in the second direction "Y" to change an optical zoom ratio of the camera module 1100b. For example, when a default optical zoom ratio of the camera module 1100b is "Z", the optical zoom ratio of the camera module 1100b may be changed to an optical zoom ratio of 3Z, 5Z, or 7Z or more by moving "m" optical lens included in the OPFE 1110.

The actuator 1130 may move the OPFE 1110 or an optical lens (hereinafter referred to as an "optical lens") to a specific location. For example, the actuator 1130 may adjust a location of an optical lens such that an image sensor 1142 is placed at a focal length of the optical lens for accurate sensing.

The image sensing device 1140 may include the image sensor 1142, control logic 1144, and a memory 1146. The image sensor 1142 may sense an image of a sensing target by using the light "L" provided through an optical lens. The control logic 1144 may control overall operations of the camera module 1100b, and may include the logic circuit described above. For example, the control logic 1144 may control an operation of the camera module 1100b based on a control signal provided through a control signal line CSLb.

The memory 1146 may store information, which is necessary for an operation of the camera module 1100b, such as calibration data 1147. The calibration data 1147 may include information necessary for the camera module 1100b to generate image data by using the light "L" provided from the outside. The calibration data 1147 may include, for example, information about the degree of rotation described above, information about a focal length, information about an optical axis, etc. In the case where the camera module 1100b is implemented in the form of a multi-state camera in which a focal length varies depending on a location of an optical lens, the calibration data 1147 may include a focal length value for each location (or state) of the optical lens and information about auto focusing. The memory 1146 may store information about an ROI necessary for a shift of an angle of view of the present inventive concepts.

The storage device 1150 may store image data sensed through the image sensor 1142. The storage device 1150 may be disposed outside the image sensing device 1140 and may be implemented in a shape where the storage device 1150 and a sensor chip constituting the image sensing device 1140 are stacked. In some example embodiments, the storage device 1150 may be implemented with an electrically erasable programmable read only memory (EEPROM), but embodiments are not limited thereto.

Referring to FIGS. 14 and 15 together, in some example embodiments, each of the plurality of camera modules 1100a, 1100b, and 1100c may include the actuator 1130. As such, the same calibration data 1147 or different calibration data 1147 may be included in the plurality of camera modules 1100a, 1100b, and 1100c depending on operations of the actuators 1130 therein.

In some example embodiments, one camera module (e.g., 1100b) among the plurality of camera modules 1100a, 1100b, and 1100c may be a folded lens shape of camera module in which the prism 1105 and the OPFE 1110 described above are included, and the remaining camera modules (e.g., 1100a and 1100c) may be a vertical shape of camera module in which the prism 1105 and the OPFE 1110 described above are not included; however, embodiments are not limited thereto.

In some example embodiments, one camera module (e.g., 1100c) among the plurality of camera modules 1100a, 1100b, and 1100c may be, for example, a vertical shape of depth camera extracting depth information by using an infrared ray (IR). In this case, the application processor 1200 may merge image data provided from the depth camera and image data provided from any other camera module (e.g., 1100a or 1100b) and may generate a three-dimensional (3D) depth image.

In some example embodiments, at least two camera modules (e.g., 1100a and 1100b) among the plurality of camera modules 1100a, 1100b, and 1100c may have different fields of view (FoV). In this case, the at least two camera modules (e.g., 1100a and 1100b) among the plurality of camera modules 1100a, 1100b, and 1100c may include different optical lens, not limited to.

Also, in some example embodiments, angles of view of the plurality of camera modules 1100a, 1100b, and 1100c may be different. In this case, the plurality of camera modules 1100a, 1100b, and 1100c may include different optical lens, not limited thereto.

In some example embodiments, the plurality of camera modules 1100a, 1100b, and 1100c may be disposed to be physically separated from each other. That is, the plurality of camera modules 1100a, 1100b, and 1100c may not use a sensing area of one image sensor 1142, but the plurality of camera modules 1100a, 1100b, and 1100c may include independent image sensors 1142 therein, respectively.

Returning to FIG. 14, the application processor 1200 may include an image sensor 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented with separate semiconductor chips.

The image sensor 1210 may include the plurality of sub image processors 1212a, 1212b, and 1212c, the number of which corresponds to the number of the plurality of camera modules 1100a, 1100b, and 1100c. The image sensor 1210 may include the plurality of sub image processors 1212a, 1212b, and 1212c that respectively correspond to the plurality of camera modules 1100a, 1100b, and 1100c.

Image data respectively generated from the camera modules 1100a, 1100b, and 1100c may be respectively provided to the corresponding sub image processors 1212a, 1212b, and 1212c through separated image signal lines ISLa, ISLb, and ISLc. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. This image data transmission may be performed, for example, by using a camera serial interface (CSI) based on the MIPI (Mobile Industry Processor Interface), but embodiments are not limited thereto.

Meanwhile, in some example embodiments, one sub image processor may be disposed to correspond to a plurality of camera modules. For example, the sub image processor 1212a and the sub image processor 1212c may be integrally implemented, not separated from each other as illustrated in FIG. 14; in this case, one of the pieces of image data respectively provided from the camera module 1100a and the camera module 1100c may be selected through a selection element (e.g., a multiplexer), and the selected image data may be provided to the integrated sub image processor.

The image data respectively provided to the sub image processors 1212a, 1212b, and 1212c may be provided to the image generator 1214. The image generator 1214 may generate an output image by using the image data respectively provided from the sub image processors 1212a, 1212b, and 1212c, depending on image generating information Generating Information or a mode signal.

In detail, the image generator 1214 may generate the output image by merging at least a portion of the image data respectively generated from the camera modules 1100a, 1100b, and 1100c having different angles of view, depending on the image generating information Generating Information or the mode signal. Also, the image generator 1214 may generate the output image by selecting one of the image data respectively generated from the camera modules 1100a, 1100b, and 1100c having different fields of view, depending on the image generating information Generating Information or the mode signal.

In some example embodiments, the image generating information Generating Information may include a zoom signal or a zoom factor. Also, in some example embodiments, the mode signal may be, for example, a signal based on a mode selected from a user.

In the case where the image generating information Generating Information is the zoom signal (or zoom factor)

and the camera modules 1100a, 1100b, and 1100c have different visual fields (or fields of view), the image generator 1214 may perform different operations depending on a kind of the zoom signal. For example, in the case where the zoom signal is a first signal, the image generator 1214 may merge the image data output from the camera module 1100a and the image data output from the camera module 1100c and may generate the output image by using the merged image signal and the image data output from the camera module 1100b that is not used in the merging operation.

In the case where the zoom signal is a second signal different from the first signal, without the image data merging operation, the image generator 1214 may select one of the image data respectively output from the camera modules 1100a, 1100b, and 1100c and may output the selected image data as the output image. However, embodiments are not limited thereto, and a way to process image data may be modified without limitation if necessary.

In some example embodiments, the image generator 1214 may generate merged image data having an increased dynamic range by receiving a plurality of image data of different exposure times from at least one of the plurality of sub image processors 1212a, 1212b, and 1212c and performing high dynamic range (HDR) processing on the plurality of image data.

The camera module controller 1216 may provide control signals to the camera modules 1100a, 1100b, and 1100c, respectively. The control signals generated from the camera module controller 1216 may be respectively provided to the corresponding camera modules 1100a, 1100b, and 1100c through control signal lines CSLa, CSLb, and CSLc separated from each other.

One of the plurality of camera modules 1100a, 1100b, and 1100c may be designated as a master camera (e.g., 1100b) depending on the image generating information Generating Information including a zoom signal or the mode signal, and the remaining camera modules (e.g., 1100a and 1100c) may be designated as a slave camera. The above designation information may be included in the control signals, and the control signals including the designation information may be respectively provided to the corresponding camera modules 1100a, 1100b, and 1100c through the control signal lines CSLa, CSLb, and CSLc separated from each other.

Camera modules operating as a master and a slave may be changed depending on the zoom factor or an operating mode signal. For example, in the case where the field of view of the camera module 1100a is wider than the field of view of the camera module 1100b and the zoom factor indicates a low zoom ratio, the camera module 1100b may operate as a master, and the camera module 1100a may operate as a slave. In contrast, in the case where the zoom factor indicates a high zoom ratio, the camera module 1100a may operate as a master, and the camera module 1100b may operate as a slave.

In some example embodiments, the control signal provided from the camera module controller 1216 to each of the camera modules 1100a, 1100b, and 1100c may include a sync enable signal. For example, in the case where the camera module 1100b is used as a master camera and the camera modules 1100a and 1100c are used as a slave camera, the camera module controller 1216 may transmit the sync enable signal to the camera module 1100b. The camera module 1100b that is provided with sync enable signal may generate a sync signal based on the provided sync enable signal and may provide the generated sync signal to the camera modules 1100a and 1100c through a sync signal line SSL. The camera module 1100b and the camera modules 1100a and 1100c may be synchronized with the sync signal to transmit image data to the application processor 1200.

In some example embodiments, the control signal provided from the camera module controller 1216 to each of the camera modules 1100a, 1100b, and 1100c may include mode information according to the mode signal. Based on the mode information, the plurality of camera modules 1100a, 1100b, and 1100c may operate in a first operating mode and a second operating mode with regard to a sensing speed.

In the first operating mode, the plurality of camera modules 1100a, 1100b, and 1100c may generate image signals at a first speed (e.g., may generate image signals of a first frame rate), may encode the image signals at a second speed (e.g., may encode the image signal of a second frame rate higher than the first frame rate), and transmit the encoded image signals to the application processor 1200. In this case, the second speed may be 30 times or less the first speed.

The application processor 1200 may store the received image signals, that is, the encoded image signals in the internal memory 1230 provided therein or the external memory 1400 placed outside the application processor 1200. Afterwards, the application processor 1200 may read and decode the encoded image signals from the internal memory 1230 or the external memory 1400 and may display image data generated based on the decoded image signals. For example, the corresponding one among sub image processors 1212a, 1212b, and 1212c of the image sensor 1210 may perform decoding and may also perform image processing on the decoded image signal.

In the second operating mode, the plurality of camera modules 1100a, 1100b, and 1100c may generate image signals at a third speed (e.g., may generate image signals of a third frame rate lower than the first frame rate) and transmit the image signals to the application processor 1200. The image signals provided to the application processor 1200 may be signals that are not encoded. The application processor 1200 may perform image processing on the received image signals or may store the image signals in the internal memory 1230 or the external memory 1400.

The PMIC 1300 may supply powers, for example, power supply voltages to the plurality of camera modules 1100a, 1100b, and 1100c, respectively. For example, under control of the application processor 1200, the PMIC 1300 may supply a first power to the camera module 1100a through a power signal line PSLa, may supply a second power to the camera module 1100b through a power signal line PSLb, and may supply a third power to the camera module 1100c through a power signal line PSLc.

In response to a power control signal PCON from the application processor 1200, the PMIC 1300 may generate a power corresponding to each of the plurality of camera modules 1100a, 1100b, and 1100c and may adjust a level of the power. The power control signal PCON may include a power adjustment signal for each operating mode of the plurality of camera modules 1100a, 1100b, and 1100c. For example, the operating mode may include a low-power mode. In this case, the power control signal PCON may include information about a camera module operating in the low-power mode and a set power level. Levels of the powers respectively provided to the plurality of camera modules 1100a, 1100b, and 1100c may be identical to each other or may be different from each other. Also, a level of a power may be dynamically changed.

As described herein, any devices, electronic devices, modules, units, controllers, circuits, camera modules, image sensors, and/or portions thereof according to any of the example embodiments, and/or any portions thereof (including, without limitation, the image sensor 1, image sensor 100, "read circuit" as described herein, analog-to-digital converters 130, data bus 170, logic circuit 190, timing controller 140, pixel boosting controller 160, ramp signal generator 150, row driver 120, buffer 180, electronic device 1000, application processor 1200, image sensor 1210, image generator 1214, sub image processors 1212a, 1212b, 1212c, camera module controller 1216, memory controller 1220, PMIC 1300, external memory 1400, internal memory 1230, image sensing device 1140, control logic 1144, image sensor 1142, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of the image sensor, including the functionality and/or methods performed by some or all of any devices, electronic devices, modules, controllers, units, camera modules, image sensors, and/or portions thereof according to any of the example embodiments, and/or any portions thereof.

Any of the memories described herein, including, without limitation, internal memory 1230, external memory 1400, memory 1146, and/or storage device 1150 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM).

According to some example embodiments of the present inventive concepts, as a spider routing is provided such that column lines of an image sensor have the same time constant, the performance of the image sensor may be improved.

While the present inventive concepts has been described with reference to some example embodiments thereof, it will be apparent to those of ordinary skill in the art that various changes and modifications may be made thereto without departing from the spirit and scope of the present inventive concepts as set forth in the following claims.

What is claimed is:
1. An image sensor, comprising:
a pixel array including a first pixel connected with a first column line, and a second pixel connected with a second column line spaced from the first column line in a first direction; and
a read circuit configured to receive pixel signals through the first column line and the second column line connected with a first interlayer connection region,
wherein the first column line includes a main wire of the first column line that extends in a second direction perpendicular to the first direction, a first wire of the first column line that is between one end of the main wire of the first column line and the first interlayer connection region, and a second wire of the first column line that is connected with an opposite end of the main wire of the first column line,
wherein the second column line includes a main wire of the second column line that extends in the second direction, a first wire of the second column line that is between one end of the main wire of the second column line and the first interlayer connection region, and a second wire of the second column line that is connected with an opposite end of the main wire of the second column line,
wherein a first distance between the main wire of the first column line and the main wire of the second column line is longer than a second distance between a point where the first column line is connected with the first interlayer connection region and a point where the second column line is connected with the first interlayer connection region,
wherein a length of the first wire of the first column line is greater than a length of the first wire of the second column line, and
wherein a length of the second wire of the first column line is smaller than a length of the second wire of the second column line.

2. The image sensor of claim 1, wherein a third distance between a point where the second wire of the first column line ends and a point where the second wire of the second column line ends is smaller than the first distance.

3. The image sensor of claim 2, wherein the second distance and the third distance are equal.

4. The image sensor of claim 1, wherein
the pixel array and the first interlayer connection region are on a first semiconductor chip, and
the read circuit is on a second semiconductor chip.

5. The image sensor of claim 4, wherein
the second semiconductor chip includes a second interlayer connection region electrically connected with the first interlayer connection region, and
the read circuit includes
analog-to-digital converters configured to convert analog signals, which are output from the first pixel and the second pixel and are received through the second interlayer connection region, into digital signals; and
a logic circuit configured to process the digital signals that are output by the analog-to-digital converters.

6. The image sensor of claim 5, wherein the analog-to-digital converters include
a current source configured to discharge charges of the first column line; and
a switch configured to connect the first column line and the current source.

7. The image sensor of claim 6, wherein the read circuit is further configured to control the switch.

8. The image sensor of claim 1, wherein a length of the first column line and a length of the second column line are equal to each other.

9. The image sensor of claim 1, wherein the second wire of the second column line has a spiral shape.

10. The image sensor of claim 1, wherein the second wire of the second column line includes at least one protrusion extending in a direction different from a direction in which a separate portion of the second wire of the second column line extends.

11. An image sensor, comprising:
a first semiconductor chip including a pixel array and a first interlayer connection region, wherein the pixel array includes
a first pixel connected with a first column line, and
a second pixel connected with a second column line isolated from direct contact with the first column line in a first direction, the first column line and the second column line being connected with the first interlayer connection region; and
a second semiconductor chip including a second interlayer connection region and a read circuit, wherein the read circuit includes
analog-to-digital converters configured to process outputs of the first pixel and the second pixel,
wherein the first column line includes a main wire of the first column line that extends in a second direction perpendicular to the first direction, a first wire of the first column line that is between one end of the main wire of the first column line and the first interlayer connection region, and a second wire of the first column line that is connected with an opposite end of the main wire of the first column line,
wherein the second column line includes a main wire of the second column line that extends in the second direction, a first wire of the second column line that is between one end of the main wire of the second column line and the first interlayer connection region, and a second wire of the second column line that is connected with an opposite end of the main wire of the second column line,
wherein a first distance between the main wire of the first column line and the main wire of the second column line is longer than a second distance between a point where the first column line is connected with the first interlayer connection region and a point where the second column line is connected with the first interlayer connection region,
wherein a length of the first wire of the first column line is greater than a length of the first wire of the second column line,
wherein a length of the second wire of the first column line is smaller than a length of the second wire of the second column line, and
wherein the first interlayer connection region and the second interlayer connection region are electrically connected.

12. The image sensor of claim 11, further comprising:
an insertion layer electrically connecting the first interlayer connection region and the second interlayer connection region.

13. The image sensor of claim 11, wherein a third distance between a point where the second wire of the first column line ends and a point where the second wire of the second column line ends is smaller than the first distance.

14. The image sensor of claim 13, wherein the second distance and the third distance are equal.

15. The image sensor of claim 11, wherein the read circuit further includes:
a logic circuit configured to process an output of the analog-to-digital converters.

16. The image sensor of claim 11, wherein the analog-to-digital converters include
a first analog-to-digital converter that includes
a first current source configured to discharge charges of the first column line; and
a first switch configured to connect the first column line and the first current source, and
a second analog-to-digital converter that includes
a second current source configured to discharge charges of the second column line; and
a second switch configured to connect the second column line and the second current source.

17. An image sensor, comprising:
a first semiconductor chip including a pixel array and a first interlayer connection region, wherein the pixel array includes
a first pixel connected with a first column line, and
a second pixel connected with a second column line isolated from direct contact with the first column line in a first direction, the first column line and the second column line being connected with the first interlayer connection region; and
a second semiconductor chip including a read circuit and a second interlayer connection region electrically connected with the first interlayer connection region, wherein the read circuit includes
a first analog-to-digital converter configured to process an output of the first pixel, and
a second analog-to-digital converter configured to process an output of the second pixel,
wherein the first column line includes
a main wire of the first column line that extends in a second direction perpendicular to the first direction and includes one end connected with the first interlayer connection region, and
a first wire of the first column line that is connected with an opposite end of the main wire,
wherein the second column line includes
a main wire of the second column line that extends in the second direction and includes one end connected with the first interlayer connection region, and
a first wire of the second column line that is connected with an opposite end of the main wire of the second column line,
wherein the second semiconductor chip further includes a third wire electrically connected with the first column line through the first interlayer connection region and the second interlayer connection region and electrically connected with the first analog-to-digital converter,
wherein the second semiconductor chip further includes a fourth wire electrically connected with the second column line through the first interlayer connection region and the second interlayer connection region and electrically connected with the second analog-to-digital converter,
wherein a first distance between the main wire of the first column line and the main wire of the second column line is longer than a second distance between a point where the third wire is connected with the first analog-to-digital converter and a point where the fourth wire is connected with the second analog-to-digital converter, and
wherein a length of the first wire of the first column line is longer than a length of the third wire.

18. The image sensor of claim 17, further comprising:
an insertion layer electrically connecting the first interlayer connection region and the second interlayer connection region.

19. The image sensor of claim 17, wherein a third distance between a point where the first wire of the first column line ends and a point where the first wire of the second column line ends is smaller than the first distance.

20. The image sensor of claim 19, wherein the second distance and the third distance are equal.

* * * * *